United States Patent
Chen

(10) Patent No.: US 10,622,070 B2
(45) Date of Patent: *Apr. 14, 2020

(54) FERROELECTRIC MEMORY DEVICE

(71) Applicant: AP Memory Corp, USA, Beaverton, OR (US)

(72) Inventor: Wenliang Chen, Vancouver, WA (US)

(73) Assignee: AP Memory Corp, USA, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/142,946

(22) Filed: Sep. 26, 2018

(65) Prior Publication Data

US 2019/0147951 A1    May 16, 2019

Related U.S. Application Data

(60) Continuation-in-part of application No. 16/133,564, filed on Sep. 17, 2018, which is a division of application No. 15/224,438, filed on Jul. 29, 2016, now Pat. No. 10,109,350, application No. 16/142,946, which is a continuation-in-part of application No. 15/224,438, filed on Jul. 29, 2016, now Pat. No. 10,109,350.

(51) Int. Cl.
    *G11C 11/22*    (2006.01)
    *G11C 14/00*    (2006.01)

(52) U.S. Cl.
    CPC ........ *G11C 14/0072* (2013.01); *G11C 11/221* (2013.01); *G11C 11/2273* (2013.01); *G11C 11/2275* (2013.01)

(58) Field of Classification Search
    CPC .................... G11C 14/0072; G11C 11/221
    USPC .......................................... 365/145
    See application file for complete search history.

(56) References Cited

U.S. PATENT DOCUMENTS

| | | | |
|---|---|---|---|
| 2,736,880 A | 2/1956 | Forrester | |
| 6,327,204 B1 | 12/2001 | Kook | |
| 7,336,532 B2 | 2/2008 | Chen | |
| 7,339,218 B2 | 3/2008 | Hidaka | |
| 7,485,473 B2 | 2/2009 | Tamura | |
| 7,576,377 B2 | 8/2009 | Hayashi | |
| 8,036,021 B2* | 10/2011 | Fukuda | G11C 5/063 365/149 |
| 8,278,181 B2 | 10/2012 | Wang | |
| 9,460,770 B1* | 10/2016 | Nicholes | G11C 11/22 |
| 10,109,350 B2 | 10/2018 | Techane | |
| 2004/0084743 A1 | 5/2004 | VanBuskirk | |
| 2004/0235259 A1 | 11/2004 | Celii | |

(Continued)

OTHER PUBLICATIONS

Cypress Semiconductor Corp. "F-RAM Technology Brief", 001-88042 Rev. *B, Jun. 2016,5 pages.*

(Continued)

*Primary Examiner* — Hoai V Ho
*Assistant Examiner* — Muna A Techane
(74) *Attorney, Agent, or Firm* — Berkeley Law & Technology Group, LLP

(57) ABSTRACT

In one embodiment, a device is described for using ferroelectric material in a memory cell without a selector device. In another embodiment, a method of operating a ferroelectric memory cell without a selector device is described. Other embodiments are likewise described.

20 Claims, 10 Drawing Sheets

(56) References Cited

U.S. PATENT DOCUMENTS

| | | | |
|---|---|---|---|
| 2005/0135140 A1* | 6/2005 | Kang | G11C 11/22 |
| | | | 365/145 |
| 2006/0033138 A1 | 2/2006 | Fukada | |
| 2006/0049435 A1 | 3/2006 | Bill | |
| 2006/0073613 A1 | 4/2006 | Aggarwal | |
| 2006/0133129 A1 | 6/2006 | Rodriguez | |
| 2009/0090950 A1 | 4/2009 | Forbes | |
| 2013/0051109 A1* | 2/2013 | Madan | G11C 7/02 |
| | | | 365/53 |

OTHER PUBLICATIONS

Masui, et al, "Ferroelectric Memory Based Secure Dynamically Programmable Gate Array", 2002 Symposium on VLSI Circuits Digest of Technical Papers, 0-7803-7310-3/02 IEEE, 4 pages.*

Miwa, et al, "NV-SRAM: A Nonvolatile SRAM with Backup Ferroelectric Capacitors", 0018-9200/0 2001 IEEE, 6 pages.*

Muller, et al, "Ferroelectric Hafnium Oxide Based Materials and Devices: Assessment of Current Status and Future Prospects", ECS Journal of Solid State Science and Technology, 4 (5) N30-N35, 2015, 6 pages.*

U.S. Appl. No. 16/133,564, filed Oct. 19, 2018, 3 pages.

U.S. Appl. No. 16/133,564, Requirement for Restriction/Election, dated Nov. 27, 2018, 5 pages.

U.S. Appl. No. 16/133,564, Preliminary Amendment, dated Dec. 3, 2018, 7 pages.

U.S. Appl. No. 16/133,564, Response to Election/Restriction Filed, dated Jan. 24, 2019, 8 pages.

U.S. Appl. No. 16/133,564, Notice of Publication, dated Jan. 31, 2019, 1 page.

U.S. Appl. No. 16/133,564, Non-Final Rejection, dated May 28, 2019, 12 pages.

Wang, et al, "New Methods for Measuring Hysteresis Loops of Ferroelectric thin Film and Characteristics of Layer-by-Layer Crystallized Metal/Ferroelectric/Insulator/Semiconductor (MFIS) structure", Chapter 1 of the Thesis, National Chiaio Tung University Institutional Repository, 2004, https://ir.nctu.edu.tw/handle/11536/52779, 22 pages.

U.S. Appl. No. 15/224,438, Application as filed Jul. 29, 2016, 88 pages.

U.S. Appl. No. 15/224,438, Filing Receipt, filed Aug. 11, 2016, 3 pages.

U.S. Appl. No. 15/224,438, Requirement for Restriction/Election, dated Jun. 27, 2017, 6 pages.

U.S. Appl. No. 15/224,438, Response to Election/Restriction Filed, Aug. 28, 2017, 12 pages.

U.S. Appl. No. 15/224,438, Notice of Publication, dated Feb. 1, 2018, 1 page.

U.S. Appl. No. 15/224,438, Amendment/Req. Reconsideration—After Non-Final Rejection, dated Apr. 9, 2018, 15 pages.

U.S. Appl. No. 15/224,438, Notice of Allowance and Fees Due, dated Jun. 18, 2018, 9 pages.

U.S. Appl. No. 15/224,438, Issue Fee Payment, filed Sep. 18, 2018, 1 page.

U.S. Appl. No. 15/224,438, Corrected Application Data Sheet, filed Sep. 18, 2018, 7 pages.

U.S. Appl. No. 15/224,438, Filing Receipt, filed Sep. 20, 2018, 3 pages.

U.S. Appl. No. 16/133,564, Application as Filed, filed Sep. 17, 2018, 96 pages.

U.S. Appl. No. 16/133,564, Amendment/Req. Reconsideration—After Non-Final Rejection, dated Aug. 28, 2019, 21 pages.

* cited by examiner

700

800

US 10,622,070 B2

FERROELECTRIC MEMORY DEVICE

CROSS-REFERENCE TO RELATED APPLICATIONS

This application is a continuation-in-part of U.S. patent application Ser. No. 15/224,438, entitled "FERROELECTRIC MEMORY DEVICE," by Chen, filed Jul. 29, 2016; this application also claims priority to U.S. patent application Ser. No. 16/133,564, entitled "FERROELECTRIC MEMORY DEVICE," by Chen, filed Sep. 17, 2018; both patent applications of which are expressly incorporated in their entirety herein by reference.

BACKGROUND

1. Field

This disclosure relates generally to a ferroelectric memory cell (e.g., memory device).

2. Information

In certain types of situations, a non-volatile memory may record, store, and/or return binary digital signals (e.g., also known as "bits"), to and/or from, for example, a processor, which may, for example, provide an addressable command, e.g. as a write and/or read signal, and may be able to read a memory state of a memory cell by providing voltage signals and/or sensing voltage signals. Non-volatile memory refers to a property of being able to recover memory state after loss of, and/or resumption of, memory device power. A particular kind of non-volatile memory may use one or more ferroelectric capacitors to store one or more binary digital signals (e.g., bits) as remanent polarized states of a dielectric material, for example. Thus, for example, an electric field may drive a memory cell comprising materials, such as ferroelectric materials.

A ferroelectric memory cell may provide relatively low voltage operation and power consumption. For device applications, ferroelectric materials may involve a coercive field strength and remanent polarization in connection with corresponding hysteresis behavior, as shall be described. In some applications additional considerations, such as complementary metal oxide semiconductor (CMOS)-compatibility, scalability, available thin film technologies, thermal budget and/or signal tolerances may likewise affect desirability with respect to fabrication and/or operation of a ferroelectric memory cell (e.g., memory device).

BRIEF DESCRIPTION OF DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
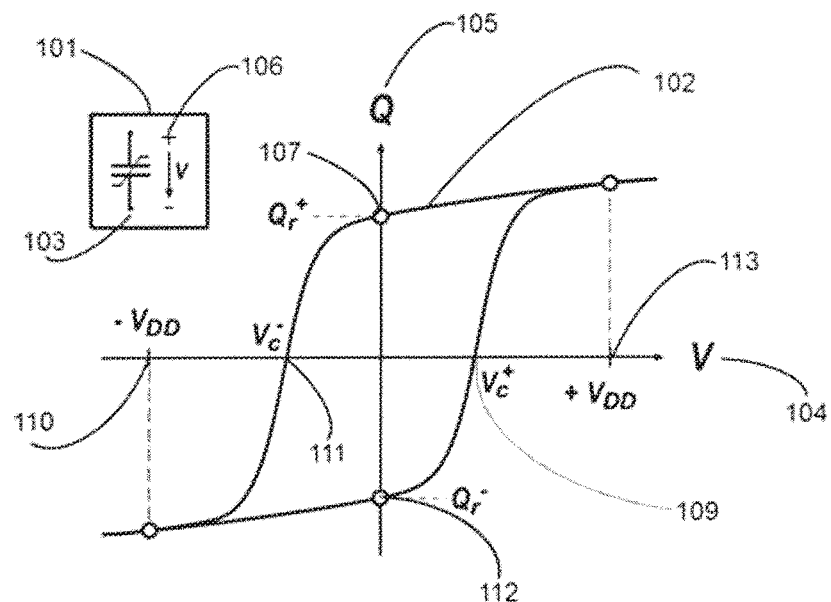
FIG. 1 is a diagram illustrating an embodiment of a ferroelectric hysteresis loop.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of subject matter intended to be covered by one or more claims (e.g., claimed subject matter). Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in relation to a particular implementation and/or embodiment is included in at least one implementation and/or embodiment of subject matter intended to be covered by one or more claims. Thus, appearances of such phrases, for example, in various places throughout this specification are not necessarily intended to refer to the same implementation and/or embodiment or to any one particular implementation and/or embodiment. Furthermore, it is to be understood that particular features, structures, and/or characteristics described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the patent application, particular context of description and/or usage provides helpful guidance regarding reasonable inferences to be drawn; however, likewise, in general, "in this context" without further qualification refers to the context of the present patent application.

A ferroelectric capacitor physical state, see, e.g. ferroelectric capacitor 103 of inset 101 in FIG. 1, may be described with reference to a ferroelectric hysteresis loop 102, for example, as a response to a signal voltage V (e.g., 106 of inset 101). However, hysteresis loop 102 is plotted on an x-y axis as a graph 100 of FIG. 1 in which an abscissa or x-axis 104 comprises a voltage signal level having a value (V) and an ordinate or y-axis 105 comprises a charge signal level having a value (Q).

Thus, FIG. 1 show a hysteresis loop embodiment example where a voltage difference with respect to (e.g., across) electrodes of ferroelectric capacitor 103, such as the voltage difference having a voltage signal level of value V may produce an electrical field in corresponding ferroelectric dielectric material. A memory cell state corresponding to a ferroelectric capacitor physical state may depend at least in part on present and/or past voltage signal level values that may result in the voltage difference, mentioned previously, and a physical state of capacitor dielectric material. If a voltage difference, such as having a voltage signal level value, is employed with respect to (e.g., across) a ferroelectric capacitor, charge may be induced, such as with respect to ferroelectric capacitor electrodes, such as those of 103. Likewise, a charge signal level of value Q may be measured (and plotted on graph 100). A convention is followed here where a polarization vector is oriented as an arrow pointing from a positive charge to a negative charge. For example, polarization 106 of ferroelectric capacitor 103 is shown with an orientation from a positive charge on an upper electrode to a negative charge on a lower electrode resulting from a voltage difference having a voltage signal level value with respect to ferroelectric capacitor 103.

Likewise, a bound charge may correspond to an electric dipole of a remanent polarized ferroelectric capacitor that may remain on a ferroelectric capacitor electrode, such on as positive electric charge 107, e.g. after removal of voltage signals resulting in a voltage difference, for example. Thus, a ferroelectric memory cell state may correspond to remanent polarization of ferroelectric capacitor dielectric material. A voltage difference, such as generated via electrodes, resulting in a sufficient voltage signal level value, for example, may be employed with a polarized ferroelectric capacitor so that a memory cell including the capacitor, for example, is switched from one binary valued state to another. It is noted that for convenience, but without loss of generality, a voltage signal level of a particular value may at times be referred to as a voltage signal level and a voltage signal level may at times be referred to as a voltage level in the present document.

In a ferroelectric capacitor, for example, if a sufficiently positive voltage signal level 113, such as having a voltage signal level value greater than the value of a coercive voltage signal level ($V_c$) 109, is used and removed, a positive polarization may remain. Similarly, a sufficiently negative voltage signal level 110, such as having a voltage signal level value less than the value of a negative coercive voltage signal level ($-V_c$) 111, may induce a negatively oriented polarization. However, if a voltage signal having a voltage signal level value (e.g., voltage magnitude) less than Vc 109 is employed, such as in a direction opposing polarization, polarization may be reduced, such as momentarily, but not reversed.

Thus, a ferroelectric capacitor employed within a memory cell, for example, may have a state capable of being switched from one polarization to an opposite polarization, such as via a sufficiently valued voltage level (e.g., voltage signal level) of opposite polarity, such as produced by a voltage difference across the ferroelectric capacitor of the memory cell. Ferroelectric material further is such that polarization does not change unless a sufficiently valued voltage level (e.g., voltage signal level) exceeds the value (e.g., voltage magnitude) of a coercive voltage level (e.g., voltage signal level) associated with the particular ferroelectric material.

For example, in one embodiment, an upper plate of ferroelectric capacitor 103 with respect to a lower plate thereof may generate a voltage difference that may correspond to a sufficiently positive voltage signal level 113 such that sufficiently positive voltage signal level 113 is greater than coercive voltage signal level 109, corresponding to a particular ferroelectric material. Therefore, a result may be that a remanent dipole occurs even after removal of the voltage difference that may correspond to voltage signal level 113, in this example, so that a state, such as binary state of capacitor 103, may have changed. Likewise, a similar result of a change in polarization state, but of opposite polarity of the prior example, may take place assuming a positive polarization state and a voltage difference of a sufficiently negative voltage signal level, such as below coercive voltage signal level 111.

A ferroelectric dielectric material may be selected, at least in part, based on providing a relatively high coercive electric field with respect to ambient signal disturbances. In this context, ambient signal disturbances, such as voltage signals, may include a variety of sources, such as 'random' and/or unplanned electrical signal fluctuations, as merely one example, perhaps from stray capacitances and/or other sources. Likewise, however, it is noted, referring, for example, to FIG. 2, discussed in more detail below, that depending on a variety of factors, including voltage signal level, signal timing, etc., a risk may be present of producing a change in polarization state in situations where such a change is not desired and/or intended. Likewise, of course, as shall also be discussed in more detail, in a number of situations, it may be desirable and/or intended, in particular, to generate a voltage difference across a memory cell having a sufficient voltage signal level so as to exceed a corresponding coercive voltage signal level in order for ferroelectric capacitor dielectric polarization state to change. However, likewise, there may be situations where while it may not be desirable and/or intended to generate a voltage difference across a memory cell having a sufficient voltage signal level so as to exceed a corresponding coercive voltage signal level in order for ferroelectric capacitor dielectric polarization (e.g., polarization state) to change; nonetheless, such a risk may be present.

One approach to at least partially take these situations into account may include appropriate selection of ferroelectric material. For example, a ferroelectric dielectric material may be chosen to be employed as part of a ferroelectric capacitor so that voltage signal ranges, such as for a voltage difference, as an example, are within acceptable parameters for electrical circuit operation. As simply one possible example, without intended to limit claimed subject matter, a relatively thin film ferroelectric material with a relatively high, approximately 1 MV/cm coercive field and an approximate thickness of 10 nm may result in approximately a one-volt signal level difference being able to be employed to switch a ferroelectric memory cell state. Again, as an illustrative, but not limiting example, a hafnium oxide material may be deposited via an atomic layer deposition technique for use as ferroelectric capacitor dielectric material in a ferroelectric memory cell. Thus, some amount of immunity (e.g., lower risk of a change in polarization state) with respect to ambient signal disturbances may be present while producing operating voltage signal level differences typically found in integrated circuit technologies, e.g. an embedded CMOS device. Likewise, potential risks from ambient signal disturbances may potentially be further reduced via geometrical and/or operational considerations associated with fabrication of a ferroelectric memory device. Again, as a non-limiting illustrative example, a relatively short bit-line for example, discussed in more detail infra., may result in a relatively reduced bit-line capacitance, which may further assist in reducing risk from ambient signal disturbances for an embodiment. One risk worthy of mention, discussed below in connection with FIG. 2, as an illustrative example, relates to an unselected bit-line voltage signal level e.g., risk associated an unselected bit-line potentially resulting in a voltage difference with respect to a memory cell so as to unintentionally switch a ferroelectric capacitor polarization state.

Figure 2:
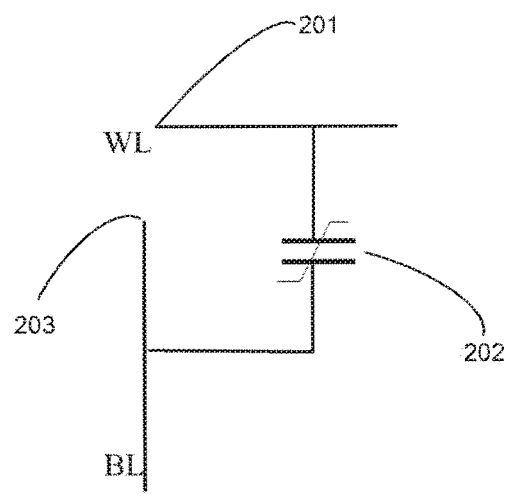
FIG. 2 is a diagram illustrating an embodiment of a ferroelectric memory cell.

Thus, referring to FIG. 2, an example embodiment of ferroelectric memory cell 200 is shown. In this example embodiment, a word-line (WL) 201 is coupled to an electrode of ferroelectric capacitor 202 and a bit-line (BL) 203 is coupled to another electrode of ferroelectric capacitor 202. Voltage signals 300, shown in FIG. 3, for an embodiment, may result in a voltage difference of a sufficient voltage signal value to be capable of being used to read from, and/or write to, ferroelectric memory cell 200 so that remanent polarization of ferroelectric material may occur or have occurred (e.g., a change a polarization state).

Figure 3:
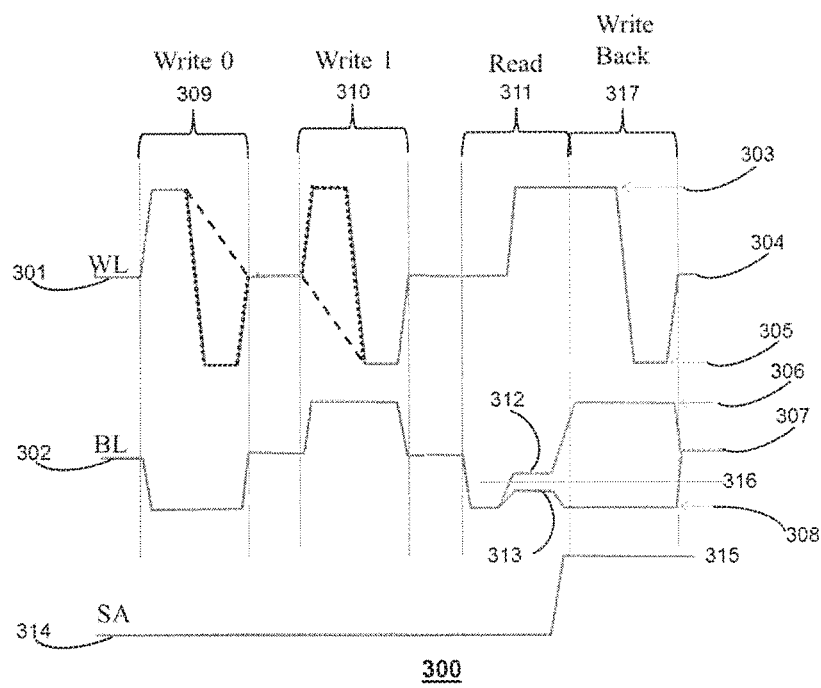
FIG. 3 is a diagram illustrating an embodiment of voltage signals to be used to operate an embodiment of a ferroelectric memory cell.

Thus, e.g. FIG. 3 shows voltage signal levels for word-line (WL) 301 and voltage signal levels for bit-line (BL) 302. WL 301 and BL 302 may respectively correspond to WL 201 and BL 203 of FIG. 2, for example. Thus, a variety of voltage signals, as is discussed in detail below, may be employed with respect to a word-line or bit-line of a memory cell, such as a ferroelectric memory cell. Three word-line voltage signals levels may, for example, be employed in an example embodiment. Thus, word-line 301 may switch from one word-line voltage signal level to two other word-line voltage signal levels, in connection with a write and/or a read voltage signal, for example. A first word-line voltage signal level 303 may exceed an intermediate word-line voltage signal level 304 and intermediate word-line voltage signal level 304 may exceed a second word-line voltage signal level 305.

Three bit-line voltage signal levels may likewise be employed for an example embodiment. Bit-line 302 may switch from one bit-line voltage signal level to two other bit-line voltage signal levels, in connection with a write and/or a read voltage signal, as described in more detail in an example embodiment. Thus, for example, a first bit-line voltage signal level 306 may exceed an intermediate bit-line voltage signal level 307 and intermediate bit-line voltage signal level 307 may exceed a second bit-line voltage signal level 308.

In one embodiment, a first of two binary signal value states, such as a binary state "Write 0" 309, shown in FIG. 3, may be written to a memory cell. For example, for a first of two voltage signals, word-line 301 may switch from intermediate word-line voltage signal level 304 to first word-line voltage signal level 303 (shown on the right hand side of FIG. 3). Likewise, for a second of two voltage signals, bit-line 302 may switch from intermediate bit-line voltage signal level 307 to second bit-line voltage signal level 308, such that a voltage difference across a memory cell is generated having a voltage signal value that may exceed a value of a corresponding coercive voltage signal level capable of resulting in ferroelectric capacitor dielectric polarization (e.g., a change in polarization state).

In one embodiment, a second of two binary signal value states, such as a binary state "Write 1" 310, shown in FIG. 3, may be written to a memory cell. For example, for a first of two voltage signals, word-line 301 may switch from intermediate word-line voltage signal level 304 to second word-line voltage signal level 305. For a second of two voltage signals, bit-line 302 may switch from intermediate bit-line voltage signal level 307 to first bit-line voltage signal level 306, such that a voltage difference across a memory cell is generated having a voltage signal value that may exceed a value of a corresponding coercive voltage signal level capable of resulting in ferroelectric capacitor dielectric polarization (e.g., a change in polarization state), but having a different polarity than the "Write 0" state example above.

Thus, a voltage difference across a memory cell may have a voltage signal value that may exceed a value of a corresponding coercive voltage signal level capable of resulting in ferroelectric capacitor dielectric polarization (e.g., a change in polarization state), which may in some situations be desirable and/or intended, as discussed above; likewise, some risk exists of polarization state changes in situations in which such a change is not desired and/or intended. One possible example relates to memory cells, for example, in which respective voltage signal levels of a write-line to a memory cell and a bit line to a memory cell, such as illustrated in FIG. 3, has a sufficient voltage signal level value, even assuming an intermediate bit-line voltage signal being present, so that with respect to the particular memory cell, a write operation may be performed, despite not being intended to be performed. In situations such as these, as indicated previously, selection of an appropriate ferroelectric material may be such that a voltage difference generated across a memory cell, such as for this latter example, is, in general at least, not of a sufficient voltage signal level value to result in a change in polarization state.

In another embodiment, a binary signal value state may be written to a memory cell, e.g. binary signal value state "Write 0" 309. For a first of two voltage signals, word-line 301 may switch from intermediate word-line voltage signal level 304 to first word-line voltage signal level 303, then word-line 301 may switch from first word-line voltage signal level 303 to second word-line voltage signal level 305. For a second of two voltage signals, bit-line 302 may switch from intermediate bit-line voltage signal level 307 to second bit-line voltage signal level 308, such that a voltage difference across a memory cell is generated having a voltage signal value (e.g., voltage signal level value) that may exceed a value of a corresponding coercive voltage signal level capable of resulting in ferroelectric capacitor dielectric polarization (e.g., a change in polarization state).

In another embodiment, a binary signal value state may be written to a memory cell, e.g. binary signal value state "Write 1" 310. For a first of two voltage signals, word-line 301 may switch from intermediate word-line voltage signal level 304 to first word-line voltage signal level 303, and may then switch from first word-line voltage signal level 303 to second word-line voltage signal level 305. For a second of two voltage signals, bit-line 302, for example, may switch from intermediate bit-line voltage signal level 307 to first bit-line voltage signal level 306, such that a voltage difference across a memory cell is generated having a voltage signal value (e.g., voltage signal level value) that may exceed a value of a corresponding coercive voltage signal level capable of resulting in ferroelectric capacitor dielectric polarization (e.g., a change in polarization state), but a different polarity than the "Write 0" state example above.

The example embodiments discussed above address writing a binary signal value state to a memory cell; likewise, a capability to read a previously stored (e.g., written) binary signal value state from a memory cell may be desirable. For example, in an embodiment, a binary signal value state previously written to ferroelectric memory may result in polarization (e.g., remanent polarization), as previously described. Thus, a binary signal value state may be read from a memory cell. For example, voltage signals, such as 311 (shown in FIG. 3), may employed in connection with a read operation.

In an example embodiment, a memory cell may be read in a manner in which a bit-line may switch from an intermediate bit-line voltage signal level to a second bit-line voltage signal level and in which a word-line may switch from an intermediate word-line voltage signal level to a first word-line voltage signal level; such that a voltage difference across a memory cell is generated having a voltage signal value (e.g., voltage signal level value) that may exceed a value of a corresponding coercive voltage signal level capable of resulting in ferroelectric capacitor dielectric polarization (e.g., a change in polarization state). Thus, in an example embodiment, a binary signal value state previously written may be read from a memory cell in a manner to result in a bit-line, such as 302, as an example, to float to voltage signal level 312 (shown in FIG. 3) corresponding to one binary signal value state or to float to voltage signal level 313 (shown in FIG. 3) corresponding to another binary signal value state.

Likewise, although not shown in FIG. 3, bit-line 302 may be coupled to a sense amplifier. Thus, a sense amplifier (SA) enable signal may switch from a voltage signal level 314 to a voltage signal level 315, for example, to enable sense amplifier operation. A sense amplifier, after being enabled, may provide a reference voltage signal level 316 in a manner such that an amplified voltage difference between a bit-line floating voltage signal level, such as 306 or 308, respectively, and reference voltage signal level 316, corresponds to a binary signal value state read from a memory cell.

If a binary signal value state is read from a memory cell corresponding to a first of two memory cell states, however, ferroelectric capacitor polarization may switch polarity. Likewise, if a binary signal value state is read from a memory cell corresponding to a second of two memory cell states, ferroelectric capacitor polarization may not necessarily switch polarity. In an embodiment, if a previously written signal value state read is one of two values and also ferroelectric capacitor polarization state has switched polarity, to restore the corresponding memory cell state, the corresponding previously written signal value state may be written back. For example, in an embodiment, voltage signals 317 may be employed in a manner to result in a word line to switch from first word-line voltage signal level 303 to second word-line voltage signal level 305 such that a voltage difference across a memory cell is generated having a voltage signal value (e.g., voltage signal level value) that may exceed a value of a corresponding coercive voltage signal level capable of resulting in ferroelectric capacitor dielectric polarization (e.g., a change in polarization state).

In one embodiment a binary signal value state may be read from a memory cell so that the binary signal value state may be sensed by a sense amplifier, e.g. by coupling a sense amplifier to a bit-line and comparing a bit-line voltage signal level via the sense amplifier to a reference voltage signal level, for example, such that a voltage difference produced, after being sensed and amplified, has a voltage signal value level to correspond to a binary signal value state to be written back to a memory cell, such as binary signal value state 309 or binary signal value state 310, for example. As described, however, it was noted that in some cases polarity may not necessarily switch with a read operation for an embodiment. Nonetheless, a corresponding previously written signal value state may be written back to memory even if polarization has not switched so that there is not a need to make a determination regarding switching of polarization. In other words, a write back operation may in most, if not all, instances follow a read operation, at least for one example embodiment.

Figure 4:
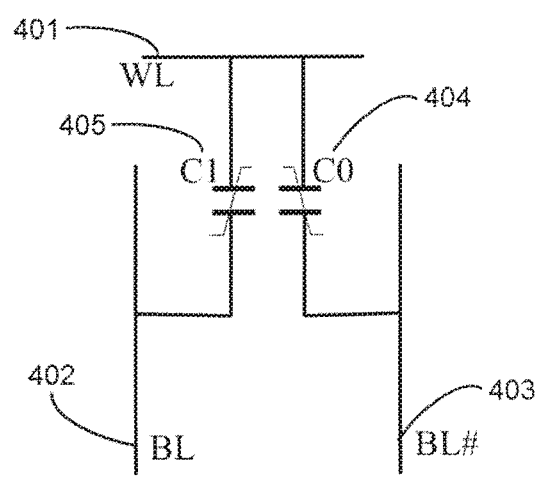
FIG. 4 is a diagram illustrating a two capacitor embodiment of a ferroelectric memory cell.

An example embodiment of ferroelectric memory cell 400 is shown in FIG. 4. As illustrated, two ferroelectric capacitors, a first capacitor C0 404 and a second capacitor C1 405, may be connected in parallel and further connected to a word-line WL 401; such that a first of two bit-lines BL 402 is connected to second capacitor C1 405, and a second of two bit-lines BL #403 is connected to first capacitor C0 404. The lines may be connected to ferroelectric memory cell 400 so as to generate at least one voltage difference across memory cell 400.

Figure 5:
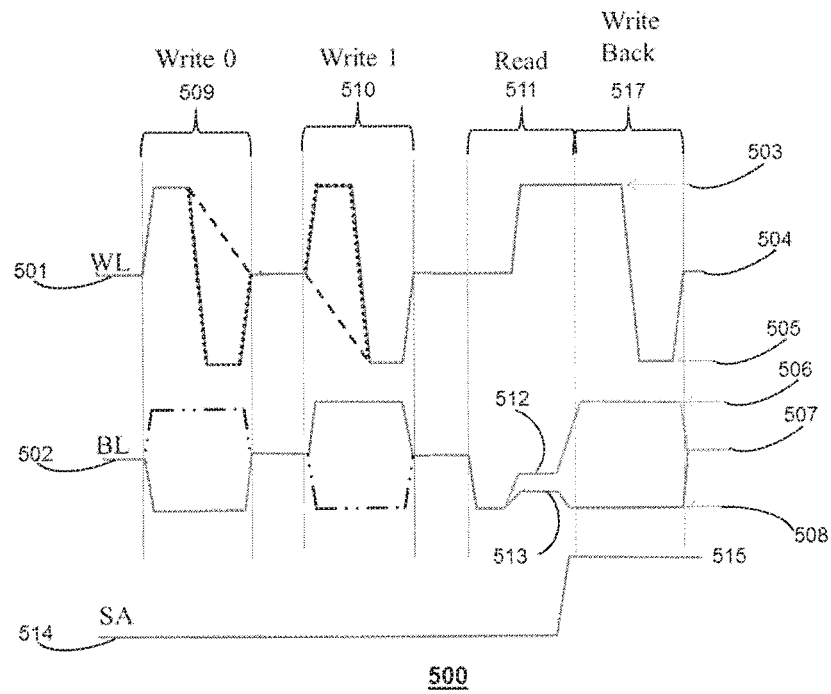
FIG. 5 is a diagram illustrating an embodiment of voltage signals to be used to operate an embodiment of a ferroelectric memory cell comprising two ferroelectric capacitors.

Referring now to FIG. 5, voltage signals 500 may be used to read from, and/or write to, ferroelectric memory cell 400 comprising two ferroelectric capacitors, e.g. FIG. 5 shows example voltage signals which may be employed for an embodiment to produce a voltage difference having a voltage signal level value so that polarization (e.g., remanent polarization) of ferroelectric material, such as a change thereof, may result.

Thus, FIG. 5 shows an embodiment with voltage signal levels for a word-line (WL) 501 and voltage signal levels for a bit-line (BL) 502. Word-line (WL) 501 may correspond to WL 401 of FIG. 4. Likewise, bit-line (BL) 502 may correspond to BL 402 or to BL 403 of FIG. 4, for example, as shall be made more clear below. Thus, a variety of voltage signals, as is discussed in detail below, may be employed with respect to a word-line or bit-line of a memory cell, such as a ferroelectric memory cell. Word-line 501 may switch from one word-line voltage signal level to two other word-line voltage signal levels, in connection with a write and/or a read voltage signal, for example.

Three word-line voltage signals levels may, for example, be employed in an example embodiment. Thus, a first word-line voltage signal level 503 may exceed an intermediate word-line voltage signal level 504 and intermediate word-line voltage signal level 504 may exceed a second word-line voltage signal level 505.

Three bit-line voltage signal levels may likewise be employed for an example embodiment. Bit-line 502 may switch from one bit-line voltage signal level to two other bit-line voltage signal levels, in connection with a write and/or a read voltage signal, as described in more detail in an example embodiment. Thus, for example, a first bit-line voltage signal level 506 may exceed an intermediate bit-line voltage signal level 507 and intermediate bit-line voltage signal level 507 may exceed a second bit-line voltage signal level 508.

In one embodiment, a first of two binary signal value states may be written to memory cell 400. For example, a binary state "Write 0" 509 may be written. For a first of two voltage signals, word-line 501 may switch from intermediate word-line voltage signal level 504 to word-line voltage signal level 503. Likewise, for a second of two voltage signals, both first bit-line BL 402 and second bit-line BL #403 may switch from intermediate bit-line voltage signal level 507. However, for 502, BL 402 may switch to second bit-line voltage signal level 508, whereas, for 502, BL #403 may switch to first bit-line voltage signal level 506. In this manner, voltage differences may be generated across two ferroelectric capacitors of a memory cell so that at least one voltage difference may have a voltage signal level value to exceed a value of a corresponding coercive voltage signal level capable of resulting in ferroelectric capacitor dielectric polarization (e.g., a change), to thereby write a binary signal value state to memory cell 400.

In one embodiment, a second of two binary signal value states, a binary state "Write 1" 510, as another example, may be written to a memory cell. For a first of two voltage signals, word-line 501 may switch from intermediate word-line voltage signal level 504 to second word-line voltage signal level 505. For a second of two voltage signals, similar to as previously described, for 502, bit-line BL 402 and bit-line BL #403 may switch from intermediate bit-line voltage signal level 507. However, for 502, bit-line BL 402 may switch to first bit-line voltage signal level 506, whereas, for 502, bit-line BL #403 may switch to second bit-line voltage signal level 508. In this manner, as previously, voltage differences may be generated across two ferroelectric capacitors of a memory cell so that at least one voltage difference may have a voltage signal level value to exceed a value of a corresponding coercive voltage signal level capable of resulting in ferroelectric capacitor dielectric polarization (e.g., a change), to thereby write a binary signal value state to memory cell 400, in this example, however, binary state "Write 1" 510, rather than binary state "Write 0" 509.

In another embodiment, a first of two binary signal value states may be written to a memory cell 400, such as binary state "Write 0" 509. For a first of two voltage signals, word-line 501 may switch from intermediate word-line voltage signal level 504 to first word-line voltage signal level 503 and then may switch from first word-line voltage signal level 503 to second word-line voltage signal level 505. For a second of two voltage signals, first bit-line BL 402 and second bit-line BL #403 may switch from intermediate bit-line voltage signal level 507, as has been discussed. Likewise, first bit-line BL 402 and second bit-line BL #403 may respectively switch to second bit-line voltage signal level 508 and to first bit-line voltage signal level 506. In this manner, voltage differences may be generated across two ferroelectric capacitors of a memory cell so that at least one voltage difference may have a voltage signal level value to exceed a value of a corresponding coercive voltage signal level capable of resulting in ferroelectric capacitor dielectric polarization (e.g., a change), to thereby write a binary signal value state to memory cell 400, in this example.

In another embodiment, a second of two binary signal value states may be written to a memory cell, such as binary state "Write 1" 510. For a first of two voltage signals, word-line 501 may switch from intermediate word-line voltage signal level 504 to first word-line voltage signal level 503 and may then switch from first word-line voltage signal level 503 to second word-line voltage signal level 505. For a second of two voltage signals, first bit-line BL 402 and second bit-line BL #403 may switch from intermediate voltage signal level 507, as has been described. Likewise, first bit-line BL 402 and second bit-line BL #403 may respectively switch to first bit-line voltage signal level 506 and to second bit-line voltage signal level 508. In this manner, as previously, voltage differences may be generated across two ferroelectric capacitors of a memory cell so that at least one voltage difference may have a voltage signal level value to exceed a value of a corresponding coercive voltage signal level capable of resulting in ferroelectric capacitor dielectric polarization (e.g., a change), to thereby write a binary signal value state to memory cell 400, in this example, however, binary state "Write 1" 510, rather than binary state "Write 0" 509.

A binary signal value state previously written to a two capacitor embodiment of ferroelectric random access memory cell 400 may result in polarization of two ferroelectric capacitors. Likewise, a binary signal value state may be read from memory cell 400. For example, voltage signals, such as 311, also described previously, may be employed in connection with a read operation. In an embodiment, for example, memory cell 400 may be operated so that bit-line 402 and bit-line 403 may be switched from intermediate bit-line voltage signal level 507 to second bit-line voltage signal level 508. Similarly, in an embodiment, memory cell 400 may be operated so that word-line 501 may be switched from intermediate word-line voltage signal level 504 to first word-line voltage signal level 503. Thus, a binary signal value state previously been written may be read in a manner to result in first bit-line 402 to float to voltage signal level 512 or second bit-line 403 to float to voltage signal level 513, respectively corresponding to a first binary signal value state or to a second binary signal value state.

If a binary signal value state is read from memory cell 400, as previously discussed with respect to FIGS. 2 and 3, polarization may switch state. Thus, for embodiment 500, for example, if ferroelectric capacitor memory polarization has switched state, to restore the corresponding memory cell state, the corresponding previously written signal value state may be written back. For example, voltage signals 517 may produce a result so that word line 401 may switch from first word-line voltage signal level 503 to second word-line voltage signal level 505 such that a voltage difference across a memory cell is generated having a voltage signal value (e.g., voltage signal level value) that may exceed a value of a corresponding coercive voltage signal level capable of resulting in ferroelectric capacitor dielectric polarization (e.g., a change in polarization state).

In one embodiment, a binary signal value state may be read from memory cell 400, and sensed by a sense amplifier. For example, a sense amplifier may be coupled to first bit-line 402 and to second bit-line 403 in a manner so as to compare first bit-line voltage signal level 512 to second bit-line voltage signal level 513 via the sense amplifier. It is noted, for example, that a sense amplifier enable voltage signal is shown in FIG. 5 as switching from voltage signal level 514 to voltage signal level 515. Thus, a voltage difference produced, after being sensed and amplified, may have a voltage signal value level to correspond to a binary signal value state to be written back to a memory cell, such as corresponding to voltage signal level 506 or to voltage signal level 508, for example.

Figure 6:
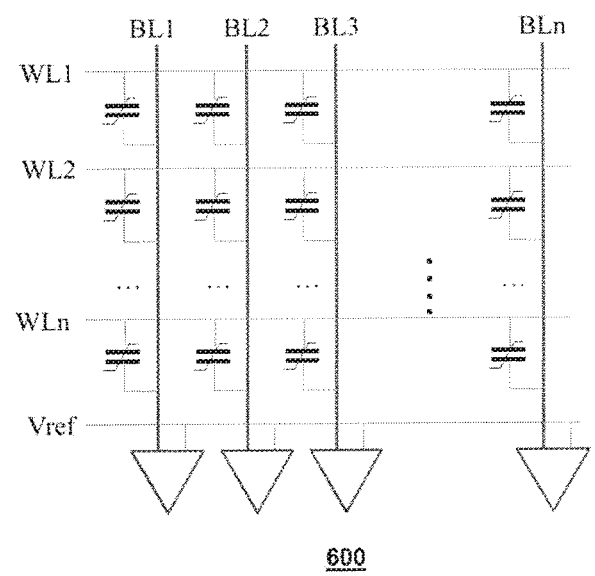
FIG. 6 is a diagram illustrating an embodiment of a ferroelectric memory cell array.

In yet another embodiment, a ferroelectric memory cell array may comprise a cross-point array, e.g. FIG. 6 shows an embodiment 600 comprising a ferroelectric capacitor located at a cross-point of a word-line and a bit-line, such as WL1 and BL1, for example. In one embodiment, if a ferroelectric capacitor cross-point array does not further comprise transistors, an array may be fabricated, such as between electrically conductive (e.g., metal) lines and/or wafer levels (or on separate wafers), in one example, as part of a backend portion of an integrated circuit IC manufacturing process flow.

Figure 7:
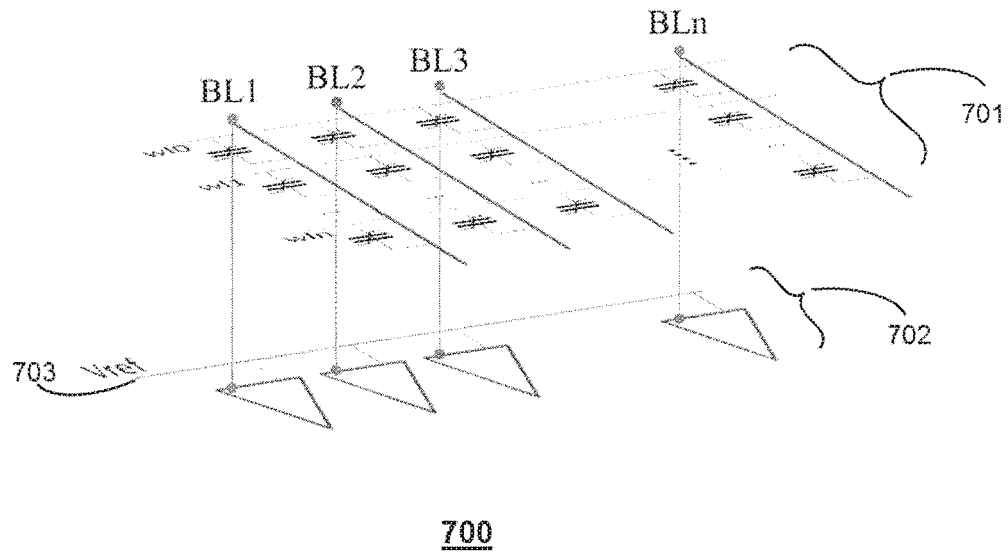
FIG. 7 is a diagram illustrating another embodiment of a ferroelectric memory cell array.

Referring now to FIG. 7, an embodiment 701 of a ferroelectric memory cell cross-point array may, for example, be fabricated on a different wafer level and/or a different wafer from sense amplifiers, such as those shown in FIG. 7 as 702, employing a shared reference voltage 703, in this example embodiment. Thus, in an embodiment, for example, a ferroelectric memory cell cross-point array embodiment may be fabricated above active circuits, e.g. sense amplifiers, transistors, etc.

In one embodiment, a cell area of a memory cross-point array may be approximately the same as an area of an active circuit. Thus, in an embodiment, for example, as shown in FIG. 7, an active circuit does not need to occupy area of an embodiment of a ferroelectric memory cell cross-point array, for example. Likewise, in an embodiment a ferroelectric memory cell cross-point array embodiment, such as shown in FIG. 7, for example, may have a relatively shorter bit-line length compared to a configuration having active devices on the same wafer level, for example. In that latter situation, such as on a single wafer having one level, as an example, significantly longer bit lines are typically employed, producing larger unnecessary capacitance. However, for an embodiment employing a shorter bit-line, such as shown in FIG. 7, for example, a memory cell size to bit-line capacitance ratio may be relatively increased so that less unnecessary capacitance results. Likewise, voltage differences produced having smaller voltage signal levels (e.g., smaller in magnitude) may nonetheless be operational for use in electronic circuitry at least in part from an improved memory cell size to bit-line capacitance ratio. In one embodiment, a ferroelectric memory cell cross-point array may be fabricated on a separate transistor-less wafer and bonded to another wafer comprising active devices, e.g. transistor circuitry.

Figure 8:
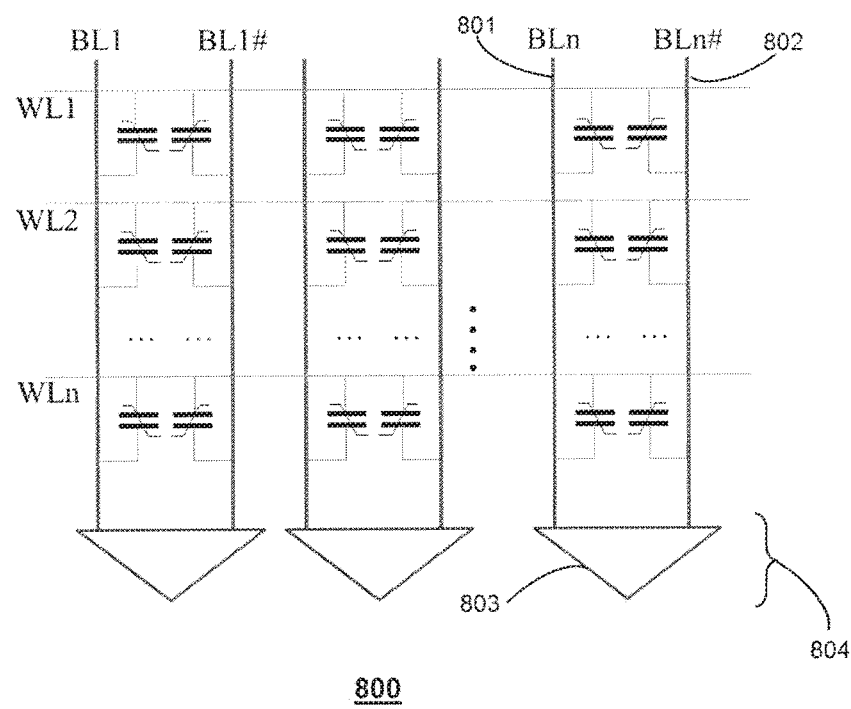
FIG. 8 is a diagram illustrating yet another embodiment of a ferroelectric memory cell array.

In yet still another embodiment 800, a ferroelectric memory cell array may comprise a cross-point array embodiment of two-capacitor memory cells, e.g., FIG. 8 shows a ferroelectric memory cell embodiment including two ferroelectric capacitors located at a cross-point of a word-line and a complementary pair of bit-lines, such as WL1 and BL1/BL1#. Likewise, for an embodiment, a complementary bit-line pair 801 and 802 of a two-capacitor memory cell may be sensed by a sense amplifier 803. By sensing two complementary bit-lines, sense amplifier 803, for example, may employ one of the two bit-lines as a voltage reference signal level, such as for use in connection with reading a state of a memory cell. Thus, in an embodiment, a cross-point array of memory cells may be fabricated, such as between electrically conductive (e.g., metal) lines and/or separate wafer levels (or on separate wafers), in one example, as part of a backend portion of an integrated circuit IC manufacturing process flow. For example, an embodiment of a ferroelectric memory cell cross-point array may be fabricated on a different wafer level from sense amplifiers at level 804.

In certain types of situations, it may be desirable to produce and/or operate a non-volatile static random access memory device (e.g. NV-SRAM) using ferroelectric memory cells. A non-volatile ferroelectric memory device may use a ferroelectric capacitor to store a binary digital signal, e.g. a binary bit, as a remanent polarized state of a dielectric material, such as for a period in which there may power loss, but in which later power may be resumed, for example. A NV-SRAM cell may comprise an SRAM circuit or cell and a non-volatile cell in an embodiment. Thus, memory states may be transferred between SRAM circuits and/or cells and non-volatile memory cells, in particular ferroelectric memory cells. For example, in one embodiment, if SRAM circuits and/or cells are written and/or, in another embodiment, before power loss is complete, transfers may be executed. Likewise, after power is resumed, memory states stored in ferroelectric memory cells may be transferred back to SRAM. Although not limited in scope in this respect, as one example, a memory state transfer process, such as just mentioned, could take place via an internal transfer mechanism within a memory device, such as via circuitry, firmware, etc., or, in another example, under direction of an external processor or similar device (e.g., microprocessor, microcontroller, CPU, etc.)

Figure 9:
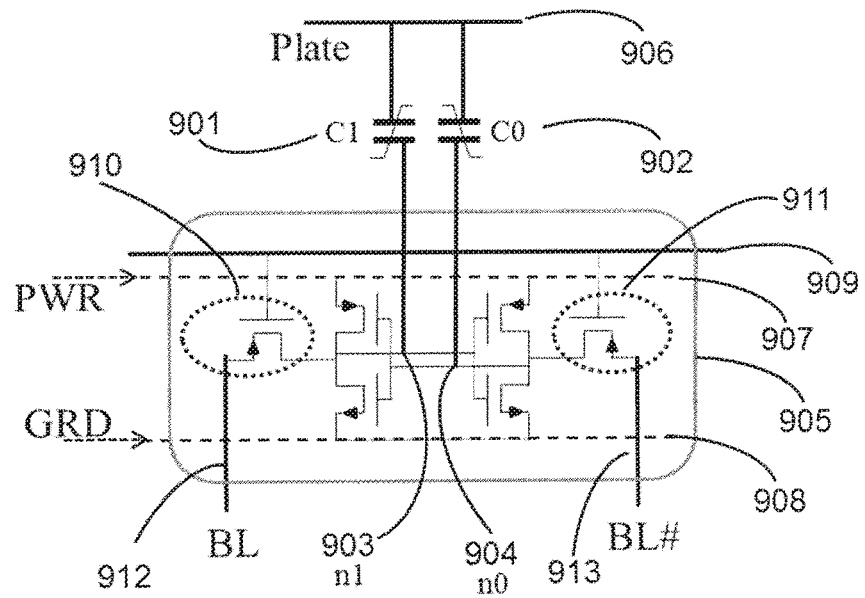
FIG. 9 is a diagram illustrating an embodiment of a ferroelectric memory cell coupled to an active device circuit.

Referring to FIG. 9, in one embodiment, a ferroelectric cross-point two-capacitor memory cell array may include plate (e.g., plate line) 906 and a memory cell including a ferroelectric capacitor 901 and a ferroelectric capacitor 902. As shown, respective electrodes of respective capacitors are respectively connected to two complementary internal nodes, n1 903 and n0 904, of an active device circuit 905, such as one forming an SRAM circuit and/or cell. Thus, active device circuit 905 may comprise a bi-stable latching circuitry (e.g., a latch or a flip-flop), such that if coupled to a ferroelectric two-capacitor memory cell may form a non-volatile static random access memory (NV-SRAM) cell. In an embodiment, plate line 906 may be common for a memory cell array, or segmented by row and/or by column. It is likewise noted that plate or plate line 906 may operate in an example embodiment as a word-line, as described in more detail below. An embodiment of an SRAM device (e.g., circuit and/or cell), such as constructed with a NV memory cell, may therefore comprise a non-volatile SRAM cell. To distinguish between read/write operations of SRAM and a transfer of states, such as between SRAM and non-volatile memory cells, a state transfer from SRAM to non-volatile memory is referred to as "store," and a transfer to SRAM from non-volatile memory is referred to as "recall."

In an embodiment, voltage signals may be used to execute store and/or recall operations, such as for a ferroelectric memory cell embodiment, such as comprising two-capacitors, for example, ferroelectric capacitor 901 and ferroelectric capacitor 902, respectively connected to two complementary internal nodes n1 903 and n0 904, of active device circuit 905. As previously suggested, storing to ferroelectric memory cells and recalling from ferroelectric memory cells may respectively occur with power loss and power resumption, for an embodiment. Thus, for example, in an embodiment, if a ferroelectric memory cell is in a standby state, e.g. not performing a store or recall operation, a plate line voltage signal level may be biased approximately halfway between a voltage signal level of a power-line 907 and a voltage signal level of a ground plane 908, which may, in effect, comprise approximately a range for an active device operating voltage, for example, in an embodiment.

Polarization of ferroelectric material may occur during a store operation, for example, so that SRAM circuits and/or cells may be updated or if power loss is about to occur or under way. A binary state to be stored may comprise "Write 0" 509 of FIG. 5. For example, plate 906 may be set at an intermediate plate-line (or write-line) voltage level 501 and a write-line 909 may switch from intermediate write-line voltage level 504 to first write-line voltage level 503, then to second write-line voltage level 505, while internal nodes n0

904 and n1 903 are maintained at their respective voltage signal levels 506 and 508. In this manner, voltage differences may be generated across two ferroelectric capacitors of a memory cell so that at least one voltage difference may have a voltage signal level value to exceed a value of a corresponding coercive voltage signal level capable of resulting in ferroelectric capacitor dielectric polarization (e.g., a change), to thereby store a binary signal value state, such as previously described, for example.

Continuing with FIG. 9, in an embodiment, a binary signal value state previously written to a ferroelectric memory cell may be recalled from the cell, such as a result of power resumption. In an embodiment, for example, word-line 909, bit-line 912, complementary bit-line 913, GND 908, SRAM PWR 909, and plate 906 may all initially be at second bit-line voltage signal level 508, and plate 906 may be switched from second bit-line voltage signal level 508 to first plate-line voltage signal level 503. Thus, voltage differences may be generated across two ferroelectric capacitors of a memory cell so that at least one voltage difference may have a voltage signal level value to exceed a value of a corresponding coercive voltage signal level capable of resulting in ferroelectric capacitor dielectric polarization (e.g., a change), and a binary signal value state previously written may be read in a manner so that first internal node n1 903 may float to voltage signal level 512 or so that second internal node n0 904 may float to voltage signal level 513 respectively corresponding to a first binary signal value state or to a second binary signal value state. Power-line 909 may be subsequently switched to voltage signal level 515 such that respective floating internal nodes having voltage signal value levels may be compared and recalled as states of a volatile memory cell (e.g., SRAM circuit and/or cell). It is further noted that plate-line 906 may be switched to intermediate word-line voltage signal level 501 to enter a standby state in this example.

However, in an embodiment, as discussed in connection with previously described embodiments, a previously written signal value state that is read may comprise at least one voltage difference that may have a voltage signal level value to exceed a value of a corresponding coercive voltage signal level capable of resulting in ferroelectric capacitor dielectric polarization (e.g., a change). Thus, to re-store the corresponding non-volatile memory cell state, the corresponding previously written signal value state may be written back to the memory cell in a manner in which plate-line 906 may switch from intermediate word-line voltage signal level 501 to first word-line voltage signal level 503, and then to switch from first word-line voltage signal level 503 to second word-line voltage level 505, such that voltage differences are generated in which at least one voltage difference may have a voltage signal level value to exceed a value of a corresponding coercive voltage signal level capable of resulting in ferroelectric capacitor dielectric polarization (e.g., a change).

As previous mentioned, a store operation may be performed just before or during a power loss in an embodiment. Likewise, in another embodiment, such as if power loss is difficult to anticipate or detect, a store operation may be performed as a matter of course with respect to a write operation to SRAM, such that non-volatile cells may be updated to SRAM content, for example. A store operation may also be performed to refresh content of non-volatile memory cells.

A recall operation may likewise in an embodiment be triggered during power-up of a memory device. Likewise, in situations where it is desirable to restore SRAM to non-volatile memory cell content, a recall operation may be triggered externally, such as by a memory controller, in an embodiment.

Figure 10:
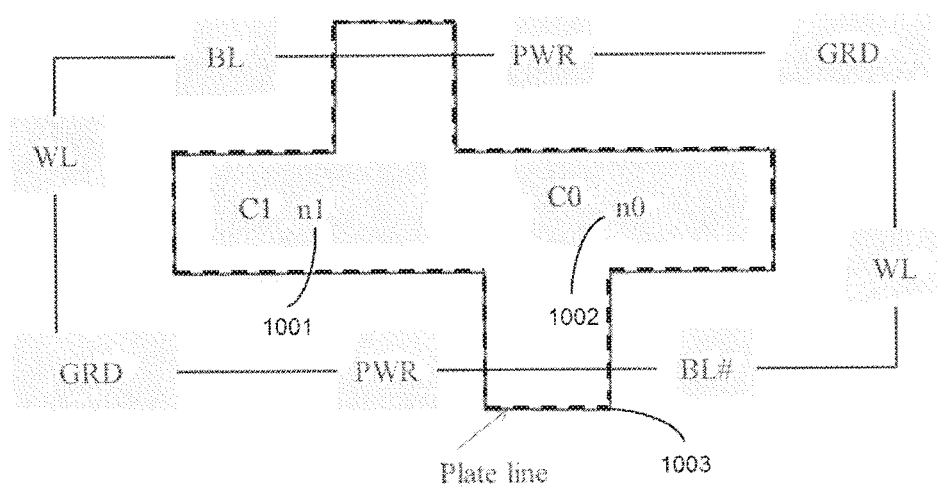
FIG. 10 is a diagram illustrating an embodiment of a ferroelectric memory cell after having performed some operations associated with manufacturing an embodiment of a ferroelectric memory cell.

FIG. 10 is a diagram illustrating an embodiment of a manufacturing method, such as, one example being for a ferroelectric random access memory two-capacitor cell coupled to an active device circuit, e.g. an active device circuit manufacturing method comprising a complementary metal-oxide semiconductor process (CMOS) with a first level layout of a ferroelectric memory cell.

In an embodiment, non-volatile SRAM (NV-SRAM), as one illustration, as described above, may be embedded in a CMOS fabrication process, for example. It is noted that although metal is mentioned below as a convenience, metal is not necessarily required as a material. Other electrical conductive materials may likewise be employed, such as polysilicon, which may or may not include metal, for example.

In one embodiment two internal nodes, e.g. n0 1001 and n1 1002 may be implemented with a first 'metal' layer, e.g., 'metal-1' layer that may comprise copper and/or tungsten, as examples. Instead, however, a local interconnect layer (e.g., 'metal-0') may comprise polysilicon, titanium nitride, and/or a tungsten material, as examples. Continuing with the first metal layer example, it may comprise a first electrode for ferroelectric capacitors in a memory cell array. Thus, in a process, a ferroelectric dielectric layer may be deposited over the first metal layer, e.g. a relatively thin, approximately 10 nm thick hafnium oxide, for example, may be deposited, such as by atomic layer deposition, and may further comprise a dielectric for a ferroelectric capacitor memory cell array. In an embodiment, the ferroelectric dielectric may be covered by another metal-like plate-layer comprising a plate electrode and a second electrode for ferroelectric capacitors in a memory cell array, e.g. titanium nitride may serve as the metal-like material, as an illustration. The ferroelectric dielectric layer and plate-layer may then be etched to form a plate-line electrode 1003. In an embodiment, a resulting plate-line may be common for a column of (NV-SRAM) cells. For example, in a process, such as the example illustrated, one mask operation to form the plate-line electrode may be added to a CMOS fabrication process.

As discussed previously, this context, ambient signal disturbances, such as voltage signals, may include a variety of sources, such as 'random' and/or unplanned electrical signal fluctuations, as merely one example, perhaps from stray capacitances and/or other sources. Thus, referring, for example, to FIG. 2, discussed in more detail previously, depending on a variety of factors, including voltage signal level, signal timing, etc., a risk may be present of producing a change in polarization state in situations where such a change is not desired and/or intended. Thus, there is a risk that there may be situations where while it may not be desirable and/or intended, a voltage difference may be generated across a memory cell having a sufficient voltage signal level so as to exceed a corresponding coercive voltage signal level in order for ferroelectric capacitor dielectric polarization (e.g., polarization state) to change; nonetheless, such a risk may be present.

As simply one possible example that relates to ferroelectric memory cells, for example, consider respective voltage signal levels of a word-line to a memory cell and a bit-line to a memory cell, such as illustrated in FIG. 3. If such word lines and bit lines are left open circuit, a risk may exist of a sufficient voltage signal level value, such as a stray or random voltage fluctuation, so that with respect to the particular memory cell, a write operation may be performed, despite not being intended to be performed. One situation, for example, may be in which a write operation is performed as to a particular memory cell. For an adjacent memory cell a similar word-line signal may be present; while a bit line signal for that adjacent memory cell may be at an intermediate level; if, however, the voltage difference between an intermediate level and a level to enable a write is sufficiently close, a stray voltage may result in a write operation with respect to the adjacent memory cell, though such a memory operation was not intended. However, as discussed previously, selection of an appropriate ferroelectric material may potentially be such that a stray or random voltage difference generated across a memory cell may, in general, not likely be of a sufficient voltage signal level value to result in a change in polarization state.

However, in some situations, appropriate choice of a ferroelectric material may not be sufficient. For example, it may be that selection of material may be limited for a variety of reasons, including cost, availability and/or compatibility with other aspects of a fabrication process, as a few examples. Likewise, even in situations where appropriate ferroelectric material is able to be employed; nonetheless, the risk of an unintended change in polarization state may not be considered acceptable, such as in situations where voltages used for polarization, e.g., such as described previously, may be at voltage signal levels such that stray voltages may potentially be problematic, with one simple example being the write operation described immediately above.

Therefore, to handle potential risks, such as the foregoing, a selector device or similar component may at times, although not necessarily in all situations, be employed, such as for a ferroelectric memory cell, as well as other types of memory cells in general, although these devices were not shown previously for ease of discussion with respect to the previously described embodiments. A selector or similar term, in this context, refers to an arrangement of one or more transistors and/or other circuit elements that permit individual memory cells to be active or inactive depending at least in part upon a state of the selector. In the context of the present document, it is understood that the terms selector, selector device, selector component, memory selector, memory cell selector, selector mechanism, selector arrangement and/or similar terms may be used interchangeable without intending to alter meaning. Furthermore, a variety of arrangements are possible for a selector device and claimed subject matter is not limited in scope to a particular arrangement.

However, typically, for example, a selector may close or open electrical paths to a particular memory cell. That is, a memory cell may be inactive and, consequently, unaffected by signals, random or not random, that may be present on a bit-line and/or word line. For example, if paths to a particular memory cell are open, the particular memory cell is inactive, thereby significantly muting the risk associated with stray voltages. With an inactive memory cell, as a result of a selector device, to inadvertently change polarization of the inactive memory cell would involve more than one stray voltage of appropriate signal level and timing, for example, which is a highly unlikely occurrence. Thus, any memory cells not in use during a particular operation will have their associated selector devices set so that those memory cells are inactive. Likewise, if a particular memory cell is to be employed in a particular operation, via the selector for the particular memory cell, the electrical paths to the particular memory cell would be closed, so that the particular memory cell is active and available to operate based at least in part on the voltages employed via appropriate bit-lines and word-lines for reading from or writing to the particular memory cell. Thus, the risk of a stray voltage leading to an unintended change in polarization state is greatly reduced since memory cells are only active if in use for particular memory operations and are otherwise inactive. One illustration of a selector device for use with ferroelectric memory is shown by a white paper from Cypress Semiconductor Corp., San Jose, Calif., published in June 2016, titled "Fe-RAM Technology Brief," having an identification no. 001-88042.

However, use of selector devices or similar components for a memory array, as an example, comes with an associated cost in terms of semiconductor real estate, so to speak. For example, in an implementation in which selector devices are employed, a memory device may include layers of memory cells disposed above a silicon substrate. As suggested above, a selector device may include one or more transistors and/or other circuit elements for an individual memory cell, where such circuit elements, including the one or more transistors, are located or disposed on a silicon substrate for the memory device, for example. However, likewise, the silicon substrate includes other components desirable for operation of memory cells of a memory device. Thus, memory device design and/or manufacture may be made more complex and/or expensive from a presence of selector devices. If for example, a memory device includes a relatively large number of layers of memory cells, such as 128 layers in one embodiment, such as for a cross-point memory array, as a non-limiting illustrative example, it may become increasingly difficult to fabricate on a single piece of silicon all the components for satisfactory operation, such as, merely as illustrative examples, multiplexors, components to address individual cells, circuits to activate bit-lines and/or write lines, etc., in addition to including selector devices for individual memory cells. That is, if selectors are included in a memory device, it might be the case that fewer memory cells might be employed for the memory device in order to also fabricate silicon able to include sufficient other appropriate circuitry for memory device operation, a potentially undesirable situation.

To handle such situations, however, as described in more detail below, a particular memory device in accordance with an embodiment may be realized without memory cell selectors for memory cells of the memory device, but in a manner so that risks associated with stray voltages, as described above, are also handled in an acceptable manner. By addressing a particular memory cell without including a memory cell selector, for example, cost and/or complexity may potentially be reduced without compromising density of a memory device in terms of memory cells for a memory core, for example. In some cases, perhaps, memory core cell density may be increased, as well. Thus, even for the foregoing embodiments, a selector may not necessarily be employed. Use of a selector, of course, relates to a design choice; however, the following embodiments may make it more acceptable to omit a selector, as show be described.

Figure 13:
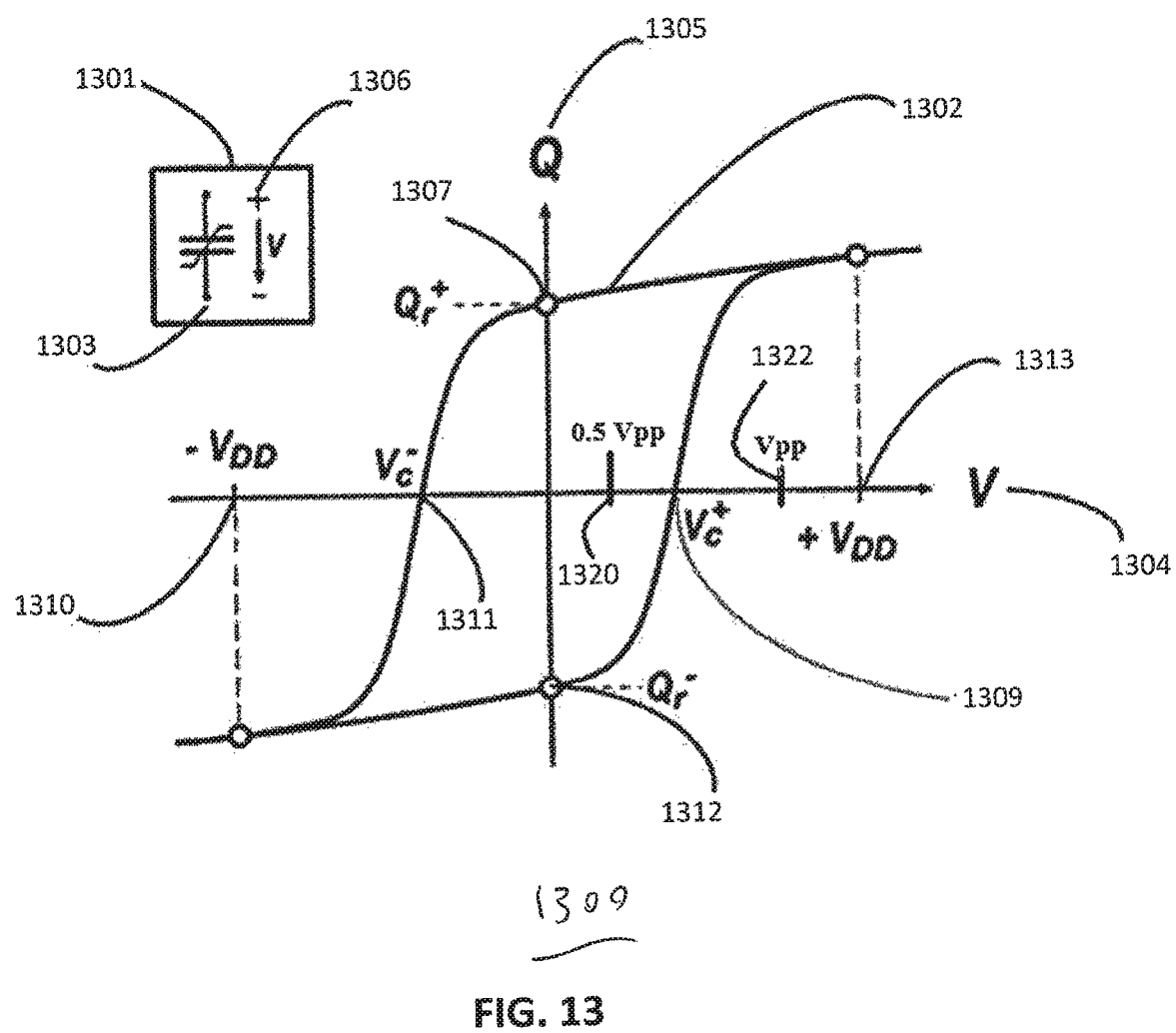
FIG. 13 is a diagram illustrating another embodiment of a ferroelectric hysteresis loop.

FIG. 13 is a diagram illustrating an embodiment of a ferroelectric hysteresis loop for a memory cell, such as a memory cell without an associated selector device. A ferroelectric capacitor physical state, see, e.g. ferroelectric capacitor 1303 of inset 1301 in FIG. 13, may be described with reference to a ferroelectric hysteresis loop 1302, for example, as a response to a signal voltage V (e.g., 1306 of inset 1301). However, hysteresis loop 1302 is plotted on an x-y axis as a graph 1300 of FIG. 13 in which an abscissa or x-axis 1304 comprises a voltage signal level having a value (V) and an ordinate or y-axis 1305 comprises a charge signal level having a value (Q).

Thus, FIG. 13 shows a hysteresis loop embodiment example where a voltage difference with respect to (e.g., across) electrodes of ferroelectric capacitor 1303, such as the voltage difference having a voltage signal level of value V, may produce an electrical field in a corresponding ferroelectric dielectric material. Polarization 1306 of ferroelectric capacitor 1303 is shown with an orientation from a positive charge on an upper electrode to a negative charge on a lower electrode resulting from a voltage difference having a voltage signal level value with respect to ferroelectric capacitor 1303. An embodiment of a ferroelectric hysteresis loop for a memory device in accordance with FIG. 13 may differ from an embodiment of a ferroelectric hysteresis loop for a memory device in accordance with FIG. 1 in that FIG. 13 illustrates Vpp and 0.5 Vpp voltage signal levels on a graph.

A bound charge may correspond to an electric dipole of a remanent polarized ferroelectric capacitor that may remain on a ferroelectric capacitor electrode, such as positive electric charge 1307, e.g., after removal of voltage signals resulting in a voltage difference, for example. Thus, a ferroelectric memory cell state may correspond to remanent polarization of ferroelectric capacitor dielectric material.

In a ferroelectric capacitor, for example, if a sufficiently positive voltage signal level 1313, such as having a voltage signal level value greater than the value of a coercive voltage signal level (Vc) 1309, is used and removed, a positive polarization may remain. Similarly, a sufficiently negative voltage signal level 1310, such as having a voltage signal level value less than the value of a negative coercive voltage signal level (−Vc) 1311, may induce a negatively oriented polarization. However, if a voltage signal having a voltage signal level value (e.g., voltage magnitude) less than Vc 1309 is employed, such as in a direction opposing polarization, polarization may be reduced, such as momentarily, but not reversed.

In one embodiment, an upper plate of ferroelectric capacitor 1303 with respect to a lower plate thereof may generate a voltage difference that may correspond to a sufficiently positive voltage signal level 1313 such that sufficiently positive voltage signal level 1313 is greater than coercive voltage signal level 1309, corresponding to a particular ferroelectric material. Therefore, a result may be that a remanent dipole occurs even after removal of the voltage difference that may correspond to voltage signal level 1313, in this example, so that a state, such as binary state of capacitor 1303, may have changed. Likewise, a similar result of a change in polarization state, but of opposite polarity of the prior example, may take place assuming a positive polarization state and a voltage difference of a sufficiently negative voltage signal level, such as below coercive voltage signal level 1311. Vpp 1322 and 0.5 Vpp 1320 are displayed on graph 1300. Thus, Vpp may comprise a particular voltage signal level Vpp to be applied to a particular memory cell which exceeds a coercive voltage signal level (+Vc) for that particular memory cell. It is noted that the previous statement also applies for opposite polarity voltages, such as −Vpp and −Vc, that is, Vpp of −Vpp exceeds Vc of −Vc.

As further illustrated in FIG. 13, coercive voltage signal level (Vc+) falls between 0.5 Vpp and Vpp, so that if a voltage signal level value of −0.5 Vpp is applied to a particular bit-line, the voltage signal level for a particular memory cell should not exceed Vc unless a voltage signal level of 0.5 Vpp is also applied to a corresponding word-line for the memory cell, such as described above with respect to embodiment 1200 of FIG. 12.

Figure 12:
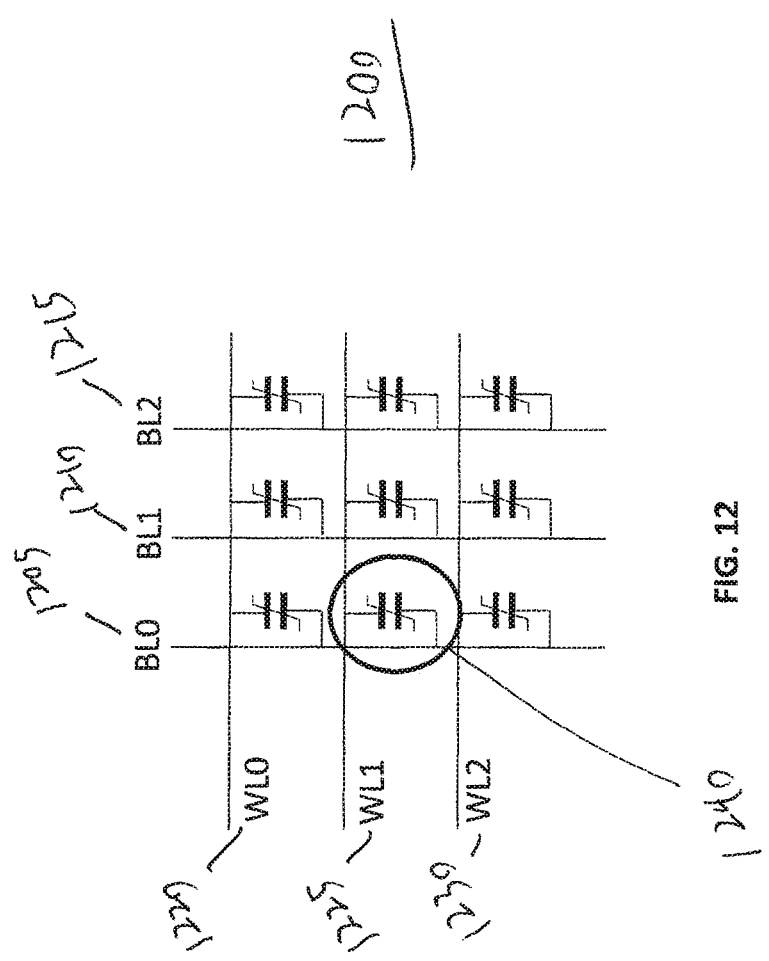
FIG. 12 is a diagram illustrating still another embodiment of a ferroelectric memory cell array.

FIG. 12 is a diagram illustrating an embodiment 1200 of a ferroelectric memory cell array. Embodiment 1200, as shown, includes three bit-lines, BL0 1205, BL1 1210, and BL2 1215; and three word-lines, WL0 1220, WL1 1225, and WL2 1230. Three bit-lines and three word-lines are shown in embodiment 1200 for the purposes of illustration, although it should be appreciated that more (or fewer) than three bit-lines and/or word-lines may be utilized in an embodiment. Embodiment 1200, thus, includes nine different memory cells that are in this illustrative example "selector-free." It is, of course, noted that claimed subject matter is not intended to be limited to examples or embodiments provided throughout this disclosure for illustration, such as the foregoing illustrative embodiment.

"Selector free," as used herein, with respect to a memory cell refers to a memory cell which is capable of being addressed via word-lines and/or bit-lines without a selector device or component. For example, a selector-free memory cell may be addressed without a silicon device to activate the particular memory cell. Such a memory cell may be understood as active, without necessarily becoming inactive, in the sense that appropriate signals to the appropriate bit-lines and word-lines result in appropriate operation. Likewise, the term "selector-free" is used with respect to a memory device if at least two or more of the memory cells of the memory device are capable of selector-free operation.

For an embodiment, however, to appropriately handle risks associated with stray voltages, an alternative set of voltage signal levels may be employed than as was described for previous embodiments. As an illustration, a particular memory cell may be addressed or accessed by providing a particular voltage signal level (Vpp) to the particular memory cell which exceeds a coercive voltage signal level (e.g., +Vc) for that particular memory cell.

Thus, referring to FIG. 12, in this example embodiment, a word-line (WL1) 1225 is coupled to an electrode of ferroelectric capacitor 1240 and a bit-line (BL0) 1205 is coupled to another electrode of ferroelectric capacitor 1240. Likewise, for an embodiment, voltage signals may result in a voltage difference of a sufficient voltage signal value to be capable of being used to read from, and/or write to, ferroelectric memory cell 1240 so that remanent polarization of ferroelectric material may occur or have occurred (e.g., a change a polarization state).

Of course, a variety of voltage signals may be employed with respect to a word-line or bit-line of a memory cell, such as a ferroelectric memory cell; however, in an embodiment, it may be desirable for particular relationships to generally apply. Thus, a word-line may switch from one word-line voltage signal level to another word-line voltage signal level, in connection with a write and/or a read voltage signal. For example, a first word-line voltage signal level may exceed a second word-line voltage signal level in the present illustrative embodiment. Similarly, a bit-line may switch from one bit-line voltage signal level to another bit-line voltage signal level, in connection with a write and/or a read voltage signal, for example. Likewise, for a bit-line, a first bit-line voltage signal level may exceed a second bit-line voltage signal level in the present illustrative embodiment.

In one embodiment, a binary state may be written to a memory cell. For example, word-line 1225 may switch from second word-line voltage signal level to a first word-line voltage signal level. Likewise, a bit-line may switch from a first bit-line voltage signal level to second bit-line voltage signal level, such that a voltage difference across a memory cell is generated having a voltage signal value that may exceed a value of a corresponding coercive voltage signal level capable of resulting in ferroelectric capacitor dielectric polarization (e.g., a change in polarization state).

In one particular implementation, a voltage signal level of approximately 0.5 Vpp may be provided to a particular word-line, and a voltage signal level of approximately −0.5 Vpp may be provided via a signal to a particular bit-line. For example, to address memory cell 1240, a voltage signal level of approximately −0.5 Vpp may be provided to BL0 1205, being switched from 0 volts, and a voltage signal level of approximately 0.5 Vpp may be provided to WL1 1225, being switched from 0 volts. Voltage signals to a word-line and a bit-line form a voltage difference to induce a change in polarization state at a particular memory cell, as described previously. Accordingly, if a voltage signal level of approximately −0.5 Vpp is provided to BL0 1205 and a voltage signal level of approximately 0.5 Vpp is provided to WL1 1225, memory cell 1240 may therefore be provided with a voltage difference of Vpp, which may comprise a sufficient voltage signal level to exceed a coercive voltage signal level for the memory cell 1240.

In such an implementation, other memory cells in embodiment 1200 may receive a voltage signal level of either 0 volts, 0.5 Vpp, or −0.5 Vpp, none of which is sufficient to overcome a coercive voltage signal level for those memory cells. For example, 0.5 Vpp or −0.5 Vpp is provided to other memory cells along BL0 1205 and WL1 1255 in this example in which the bit-line and word-line voltage signal levels are switched. However, since the other word-lines and bit-lines of those memory cells are provided 0 volts, those cells are not provided a sufficient voltage to result in a change in polarization. Such an implementation in accordance with FIG. 12 may, therefore, provide a mechanism to address or access memory cell 1240 without a selector device or component in an embodiment.

A difference between the current embodiment, described immediately above, and other previously described embodiments of a ferroelectric memory cell relates to voltage signaling. For example, for a given Vpp voltage level (which may potentially vary, for example, with semiconductor manufacturing process), the present illustrative embodiment has greater voltage margin and makes it easier to control voltage levels. Consequently, the risk that a stray voltage, for example, might inadvertently change polarization is reduced. For example, a stray voltage would need to achieve a level of 0.5 Vpp or −0.5 Vpp in this example to change polarization of the other memory cells along BL0 1205 and WL1 1255, in this example. This is more unlikely, again, due to a larger voltage margin, in this example, a margin of 0.5 Vpp, than in the previous embodiments.

While, for previous embodiments, in some cases at least, for certain ferromagnetic materials, selector devices may be desirably employed so that inadvertent changes in cell polarization do not take place, as was mentioned earlier; in this embodiment selector devices may be omitted. Again, previous embodiments may also omit a selector device; however, as described the present embodiment reduces risks associated with omission of a selector device. A capability to operate without selector devices for the present embodiment is made even more clear from considering the other memory cells in this illustration. The other memory cells in the present illustration are provided 0 volts (e.g., as a voltage level, to be distinguished from ground) along both the bit and word lines of those cells. Thus, risks of inadvertently changing polarization is muted that much more, since it would involve two stray voltages of opposing polarity for polarization of a cell to change.

It is noted that Vpp and Vc may vary with technology. For example, a particular ferroelectric material, such as hafnium oxide, has an associated Vc. Likewise, various semiconductor manufacturing technologies have associated values for Vpp. Thus, it may be appropriate to associate a semiconductor manufacturing technology with a ferroelectric material such that, as illustrated in FIG. 13, Vc falls roughly mid-between Vpp and 0.5 Vpp. In this manner, electromagnetic noise would be less likely to degrade memory operation. For example, with such an arrangement, there is little risk of Vpp failing below Vc from such noise and little risk of 0.5 Vpp going above Vc. Also, although positive polarity values of 0.5 Vpp and Vpp are shown in FIG. 13 and discussed, corresponding considerations may apply with respect negative polarity values of −0.5 Vpp and −Vpp relative to −Vc, for example, for an embodiment.

An embodiment of a process for writing a state (e.g., a voltage signal value level) to a ferroelectric memory cell in which no selector device is associated with the particular ferroelectric memory cell may be provided. Embodiments in accordance with claimed subject matter may include various operation blocks.

A ferroelectric memory cell may comprise a ferroelectric capacitor of ferroelectric material such that polarization of the ferroelectric memory cell is capable of being switched to an opposite polarization via a sufficient voltage signal level difference of opposite polarity generated across the ferroelectric memory cell. A ferroelectric material may be utilized such that polarization of the ferroelectric memory cell does not change unless a sufficient voltage signal level difference is generated to exceed a coercive voltage signal level value associated with the particular ferroelectric material.

A word-line, for example, may be switched between a second word-line voltage signal level and a first word-line voltage signal level. A first word-line voltage signal level may exceed a second word-line voltage signal level. One non-limiting example is to switch from 0 volts to 0.5 Vpp. A bit-line may be switched between a first bit-line voltage signal level and a second bit-line voltage signal level. A first bit-line voltage signal level may exceed a second bit-line voltage signal level. One non-limiting example is to switch from 0 volts to −Vpp. A voltage signal level difference may, consequently, be generated across a ferroelectric memory cell as a result of the word-line and the bit-line being switched. As a result, a binary signal value state may be written to a ferroelectric memory cell in which the ferroelectric memory cell does not have an associated selector. Thus, in accordance with an aspect of an embodiment, for example, a binary signal value state may be written in a manner in which a word-line is switched to a first word-line voltage signal level and a bit-line is switched to a second level bit-line voltage signal level such that a voltage signal level difference across a ferroelectric memory cell generated exceeds a coercive voltage signal level value.

Figure 14:
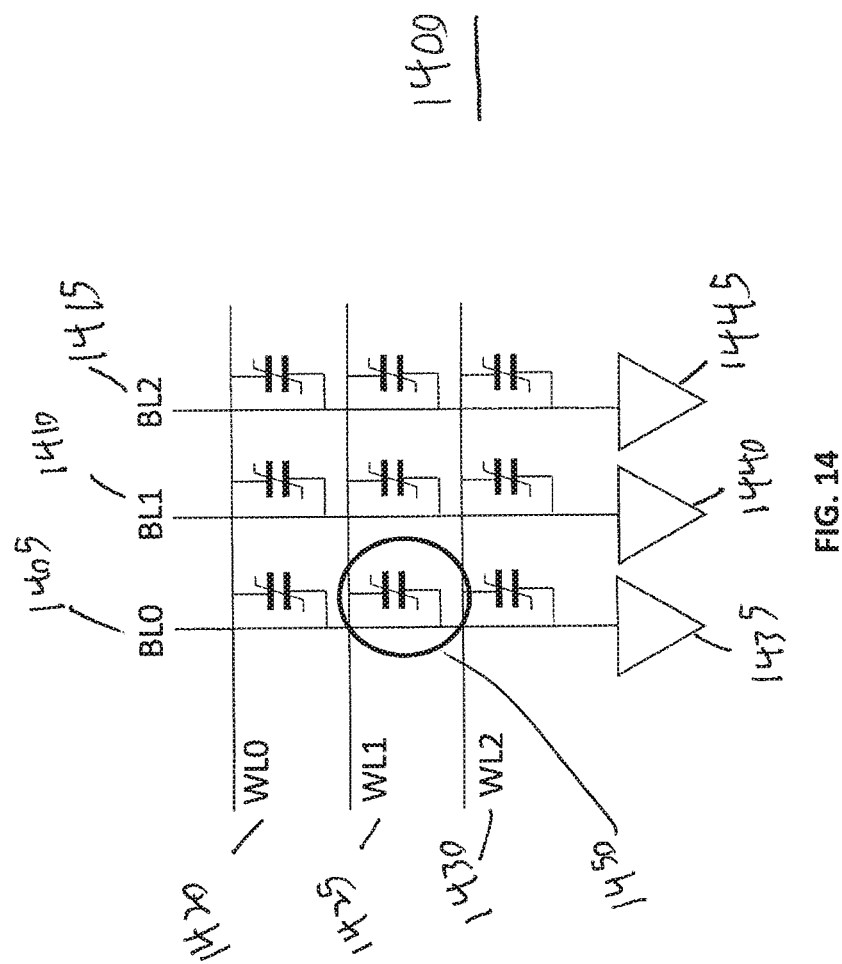
FIG. 14 is a diagram illustrating yet still another embodiment of a ferroelectric memory cell array.

FIG. 14 is a diagram illustrating an embodiment 1400 of a ferroelectric memory cell array. As shown, embodiment 1400 may include three bit-lines, BL0 1405, BL1 1410, and BL2 1415; and three word-lines, WL0 1420, WL1 1425, and WL2 1430. Three bit-lines and three word-lines are shown in embodiment 1400 for the purposes of illustration, although it should be appreciated that more (or fewer) than three bit-lines or word-lines may be utilized in accordance with an embodiment. Embodiment 1400 may include nine different memory cells which may, as shown, be selector-free. Embodiment 1400 may include a sense amplifier for one or more bit-lines, such as sense amplifier 1435 for BL0 1405, sense amplifier 1440 for BL1 1410, and sense amplifier 1445 for BL2 1415, for example. A sense amplifier may provide a reference voltage signal level in a manner such that an amplified voltage difference between a bit-line floating voltage signal level and a reference voltage signal level corresponds to a binary signal value state read from a memory cell.

A sense amplifier, such as 1435, 1440 and 1445, may be coupled to terminals Vss and Vdd, for example (not shown). Vss may comprise zero volts and Vdd may comprise a positive supply voltage, for example. An equalization voltage for a sense amplifier may comprise a voltage signal value approximately halfway between Vss and Vdd, such as 0.5 Vdd. Vpp and Vc may be technology driven values, as previously suggested; likewise, Vdd may also be a technology driven value, such as related to the particular semiconductor fabrication technology used in manufacturing the sense amplifier.

In embodiment 1400, and in general, Vpp may be higher than Vdd. By permitting Vpp to be higher than Vdd, for example, flexibility may be improved for memory array design in that an equalization voltage may be employed so that sense amplifiers are provided sufficient voltage for operation. Thus, in an embodiment, voltage signal levels provided for memory cell operation may be made relative to an equalization voltage, such as 0.5 Vdd. Thus, rather than provide a word-line voltage as +0.5 Vpp, a voltage of 0.5 Vdd+0.5 Vpp may be provided; likewise, rather than providing a bit-line voltage as −0.5 Vpp, a voltage of 0.5 Vdd−0.5 Vpp may be provided. In this manner, a voltage difference of Vpp appears across a particular memory cell for purposes of memory cell operation while concurrently providing a voltage sufficient to activate operation of a sense amplifier for the particular bit-line, such as in the case of a read operation.

Figure 15:
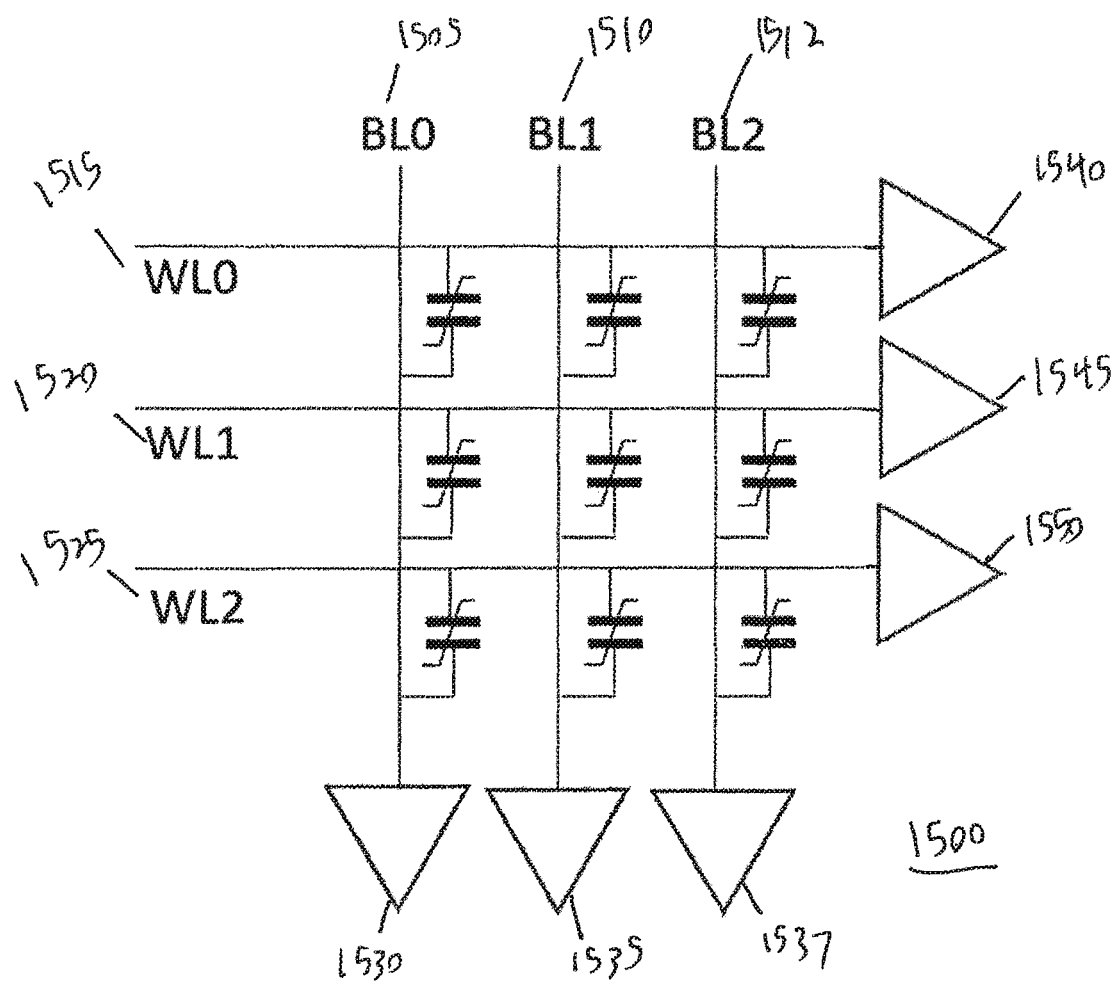
FIG. 15 is a diagram illustrating even yet another embodiment of a ferroelectric memory cell array.

FIG. 15 is a diagram illustrating an embodiment 1500 of a ferroelectric memory cell array. As shown, embodiment 1500 may include three bit-lines, BL0 1505, BL1 1510, and BL2 1512; and three word-lines, WL0 1515, WL1 1520, and WL2 1525. Three bit-lines and three word-lines are shown in embodiment 1500 for the purposes of illustration, although it should be appreciated that more (or fewer) bit-lines and/or word-lines may be utilized in accordance with an embodiment. Embodiment 1500 may include nine different memory cells which may be selector-free. Embodiment 1500 may include a sense amplifier for one or more bit-lines, such as sense amplifier 1530 for BL0 1505, sense amplifier 1535 for BL1 1510, and sense amplifier 1537 for BL2 1512, for example. Embodiment 1500 may include a sense amplifier for one or more word-lines, such as sense amplifier 1540 for WL0 1515, sense amplifier 1545 to WL1 1520, and sense amplifier 1550 for WL2 1525, for example.

As illustrated, embodiment 1500 may be symmetric in row and column directions. More specifically, via the nature of the voltage signaling employed, the ability to omit selectors, and the symmetry of the array itself, row and column positions may be viewed as nearly interchangeable. For example, by including sense amplifiers in both row and column directions, for example, stored contents of embodiment 1500 may be read either one row at a time or one column at a time. The symmetry described may therefore be employed so that contents of an array, such as embodiment 1500, may be transposed without use of additional hardware.

Memory arrays without such symmetry typically perform transposition via additional hardware in which stored signal values are read from a memory array and then are written to another memory location in the array in transposed addresses. However, given the symmetry shown, instead, transposition may be accomplished for such an embodiment simply by algorithmically addressing the appropriate memory cells in the appropriate order. That is, the contents of the individual cells are not moved to different cells within the array, as may be done for other implementations of a transposition.

As simply one practical example, if memory cells of an array correspond to pixel signal values for a digital image and/or video, such as for a tablet or smart phone, rotation of such a display such as via a transposition of pixel values stored in the memory array, may be performed. Instead of reading stored pixel values from a memory array, storing the pixel values in transposed addresses, and then subsequently reading out the pixel values from the transposed addresses, such a transposition may instead be performed via appropriate addressing of the appropriate memory cells, as previously described, such as in accordance with embodiment 1500, as one illustrative example.

To illustrate further, assume that the array shown in FIG. 15 has values stored in the respective nine cells. These values, for example, may have been written to the memory cell array row by row. Likewise, therefore, assume that the convention is to read contents out row by row, such as first cell WL0-BL0, then cell WL0-BL1 and then cell WL0-BL2, for a first row. A second row read out, likewise, would be: WL1-BL0, WL1-BL1, WL1-BL2, etc. Thus, instead, to accomplish a transpose, read out WL0-BL0, WL1-BL0, WL2-BL0 as the first row, and read out WL0-BL1, WL1-BL1, WL2-BL1 as the second row, etc. In this illustration, transposition is accomplished more easily than for alternative memory device configurations.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Additionally, in the present disclosure, in a particular context of usage, such as a situation in which tangible components (and/or similarly, tangible materials) are being discussed, a distinction exists between being "on" and being "over." As an example, deposition or growth of a substance "on" a substrate refers to a deposition or growth involving direct physical and tangible contact without an intermediary, such as an intermediary substance (e.g., an intermediary substance formed during an intervening process operation), between the substance deposited and the substrate in this latter example; nonetheless, deposition or growth "over" a substrate, while understood to potentially include deposition or growth "on" a substrate (since being "on" may also accurately be described as being "over"), is understood to include a situation in which one or more intermediaries, such as one or more intermediary substances, are present between the substance deposited or grown and the substrate so that the substance deposited or grown is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternative reasonable approaches to testing, measurement, and/or specification regarding degree, at least with respect to the property, continuing with the example, is reasonably likely to occur to one of ordinary skill, at least for implementation purposes, claimed subject matter is intended to cover those alternative reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices, one or more server devices and/or one or more peer-to-peer devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device, a client device and/or a peer-to-peer device, as well as other types of devices, including between wired and/or wireless devices coupled via a wired and/or wireless network, for example.

An example of a distributed computing system comprises the so-called Hadoop distributed computing system, which employs a map-reduce type of architecture. In the context of the present disclosure, the terms map-reduce architecture and/or similar terms are intended to refer to a distributed computing system implementation and/or embodiment for processing and/or for generating larger sets of signal samples employing map and/or reduce operations for a parallel, distributed process performed over a network of devices. A map operation and/or similar terms refer to processing of signals (e.g., signal samples) to generate one or more key-value pairs and to distribute the one or more pairs to one or more devices of the system (e.g., network). A reduce operation and/or similar terms refer to processing of signals (e.g., signal samples) via a summary operation (e.g., such as counting the number of students in a queue, yielding name frequencies, etc.). A system may employ such an architecture, such as by marshaling distributed server devices, executing various tasks in parallel, and/or managing communications, such as signal transfers, between various parts of the system (e.g., network), in an embodiment. As mentioned, one non-limiting, but well-known, example comprises the Hadoop distributed computing system. It refers to an open source implementation and/or embodiment of a map-reduce type architecture (available from the Apache Software Foundation, 1901 Munsey Drive, Forrest Hill, Md., 21050-2747), but may include other aspects, such as the Hadoop distributed file system (HDFS) (available from the Apache Software Foundation, 1901 Munsey Drive, Forrest Hill, Md., 21050-2747). In general, therefore, "Hadoop" and/or similar terms (e.g., "Hadoop-type," etc.) refer to an implementation and/or embodiment of a scheduler for executing larger processing jobs using a map-reduce architecture over a distributed system. Furthermore, in the context of the present disclosure, use of the term "Hadoop" is intended to include versions, presently known and/or to be later developed.

In the context of the present disclosure, the term network device refers to any device capable of communicating via and/or as part of a network and may comprise a computing device. While network devices may be capable of communicating signals (e.g., signal packets and/or frames), such as via a wired and/or wireless network, they may also be capable of performing operations associated with a computing device, such as arithmetic and/or logic operations, processing and/or storing operations (e.g., storing signal samples), such as in a non-transitory memory as tangible, physical memory states, and/or may, for example, operate as a server device and/or a client device in various embodiments. Network devices capable of operating as a server device, a client device and/or otherwise, may include, as examples, dedicated rack-mounted servers, desktop computers, laptop computers, set top boxes, tablets, netbooks, smart phones, wearable devices, integrated devices combining two or more features of the foregoing devices, and/or the like, or any combination thereof. As mentioned, signal packets and/or frames, for example, may be exchanged, such as between a server device and/or a client device, as well as other types of devices, including between wired and/or wireless devices coupled via a wired and/or wireless network, for example, or any combination thereof. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

It should be understood that for ease of description, a network device (also referred to as a networking device) may be embodied and/or described in terms of a computing device and vice-versa. However, it should further be understood that this description should in no way be construed so that claimed subject matter is limited to one embodiment, such as only a computing device and/or only a network device, but, instead, may be embodied as a variety of devices or combinations thereof, including, for example, one or more illustrative examples.

A network may also include now known, and/or to be later developed arrangements, derivatives, and/or improvements, including, for example, past, present and/or future mass storage, such as network attached storage (NAS), a storage area network (SAN), and/or other forms of device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as network computing and/or communications protocols (e.g., network protocols), may interoperate within a larger network.

In the context of the present disclosure, the term sub-network and/or similar terms, if used, for example, with respect to a network, refers to the network and/or a part thereof. Sub-networks may also comprise links, such as physical links, connecting and/or coupling nodes, so as to be capable to communicate signal packets and/or frames between devices of particular nodes, including via wired links, wireless links, or combinations thereof. Various types of devices, such as network devices and/or computing devices, may be made available so that device interoperability is enabled and/or, in at least some instances, may be transparent. In the context of the present disclosure, the term "transparent," if used with respect to particular communicating devices of a network, refers to the devices communicating via the network in which the devices are able to communicate via one or more intermediate devices, such as of one or more intermediate nodes, but without the communicating devices necessarily specifying the one or more intermediate nodes and/or the one or more intermediate devices of the one or more intermediate nodes. Thus, a network may include the one or more intermediate nodes and/or the one or more intermediate devices of the one or more intermediate nodes in communications and the network may engage in communications via the one or more intermediate nodes and/or the one or more intermediate devices of the one or more intermediate nodes, but the network may operate as if such intermediate nodes and/or intermediate devices are not necessarily involved in communications between the particular communicating devices. For example, a router may provide a link and/or connection between otherwise separate and/or independent LANs.

In the context of the present disclosure, a "private network" refers to a particular, limited set of devices, such as network devices and/or computing devices, able to communicate with other devices, such as network devices and/or computing devices, in the particular, limited set, such as via signal packet and/or signal frame communications, for example, without a need for re-routing and/or redirecting signal communications. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet. Although signal packet and/or frame communications (e.g. signal communications) may employ intermediate devices of intermediate nodes to exchange signal packets and/or signal frames, those intermediate devices may not necessarily be included in the private network by not being a source or designated destination for one or more signal packets and/or signal frames, for example. It is understood in the context of the present disclosure that a private network may direct outgoing signal communications to devices not in the private network, but devices outside the private network may not necessarily be able to direct inbound signal communications to devices included in the private network.

The Internet refers to a decentralized global network of interoperable networks that comply with the Internet Protocol (IP). It is noted that there are several versions of the Internet Protocol. The term Internet Protocol, IP, and/or similar terms are intended to refer to any version, now known and/or to be later developed. The Internet includes local area networks (LANs), wide area networks (WANs), wireless networks, and/or long haul networks that, for example, may allow signal packets and/or frames to be communicated between LANs. The term World Wide Web (WWW or Web) and/or similar terms may also be used, although it refers to a part of the Internet that complies with the Hypertext Transfer Protocol (HTTP). For example, network devices may engage in an HTTP session through an exchange of appropriately substantially compatible and/or substantially compliant signal packets and/or frames. It is noted that there are several versions of the Hypertext Transfer Protocol. The term Hypertext Transfer Protocol, HTTP, and/or similar terms are intended to refer to any version, now known and/or to be later developed. It is likewise noted that in various places in this document substitution of the term Internet with the term World Wide Web ("Web") may be made without a significant departure in meaning and may, therefore, also be understood in that manner if the statement would remain correct with such a substitution.

Although claimed subject matter is not in particular limited in scope to the Internet and/or to the Web; nonetheless, the Internet and/or the Web may without limitation provide a useful example of an embodiment at least for purposes of illustration. As indicated, the Internet and/or the Web may comprise a worldwide system of interoperable networks, including interoperable devices within those networks. The Internet and/or Web has evolved to a self-sustaining facility accessible to potentially billions of people or more worldwide. Also, in an embodiment, and as mentioned above, the terms "WWW" and/or "Web" refer to a part of the Internet that complies with the Hypertext Transfer Protocol. The Internet and/or the Web, therefore, in the context of the present disclosure, may comprise a service that organizes stored digital content, such as, for example, text, images, video, etc., through the use of hypermedia, for example. It is noted that a network, such as the Internet and/or Web, may be employed to store electronic files and/or electronic documents.

The term electronic file and/or the term electronic document are used throughout this document to refer to a set of stored memory states and/or a set of physical signals associated in a manner so as to thereby at least logically form a file (e.g., electronic) and/or an electronic document. That is, it is not meant to implicitly reference a particular syntax, format and/or approach used, for example, with respect to a set of associated memory states and/or a set of associated physical signals. If a particular type of file storage format and/or syntax, for example, is intended, it is referenced expressly. It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

A Hyper Text Markup Language ("HTML"), for example, may be utilized to specify digital content and/or to specify a format thereof, such as in the form of an electronic file and/or an electronic document, such as a Web page, Web site, etc., for example. An Extensible Markup Language ("XML") may also be utilized to specify digital content and/or to specify a format thereof, such as in the form of an electronic file and/or an electronic document, such as a Web page, Web site, etc., in an embodiment. Of course, HTML and/or XML are merely examples of "markup" languages, provided as non-limiting illustrations. Furthermore, HTML and/or XML are intended to refer to any version, now known and/or to be later developed, of these languages. Likewise, claimed subject matter are not intended to be limited to examples provided as illustrations, of course.

In the context of the present disclosure, the term "Web site" and/or similar terms refer to Web pages that are associated electronically to form a particular collection thereof. Also, in the context of the present disclosure, "Web page" and/or similar terms refer to an electronic file and/or an electronic document accessible via a network, including by specifying a uniform resource locator (URL) for accessibility via the Web, in an example embodiment. As alluded to above, in one or more embodiments, a Web page may comprise digital content coded (e.g., via computer instructions) using one or more languages, such as, for example, markup languages, including HTML and/or XML, although claimed subject matter is not limited in scope in this respect. Also, in one or more embodiments, application developers may write code (e.g., computer instructions) in the form of JavaScript (or other programming languages), for example, executable by a computing device to provide digital content to populate an electronic document and/or an electronic file in an appropriate format, such as for use in a particular application, for example. Use of the term "JavaScript" and/or similar terms intended to refer to one or more particular programming languages are intended to refer to any version of the one or more programming languages identified, now known and/or to be later developed. Thus, JavaScript is merely an example programming language. As was mentioned, claimed subject matter is not intended to be limited to examples and/or illustrations.

In the context of the present disclosure, the terms "entry," "electronic entry," "document," "electronic document," "content,", "digital content," "item," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present disclosure, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present disclosure, a component is physical, but is not necessarily tangible. As an example, components with reference to an electronic document and/or electronic file, in one or more embodiments, may comprise text, for example, in the form of physical signals and/or physical states (e.g., capable of being physically displayed and/or maintained as a memory state in a tangible memory). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed and/or maintained as a memory state in a tangible memory). In an embodiment, digital content may comprise, for example, text, images, audio, video, haptic content and/or other types of electronic documents and/or electronic files, including portions thereof, for example.

Also, in the context of the present disclosure, the term parameters (e.g., one or more parameters) refer to material descriptive of a collection of signal samples, such as one or more electronic documents and/or electronic files, and exist in the form of physical signals and/or physical states, such as memory states. For example, one or more parameters, such as referring to an electronic document and/or an electronic file comprising an image, may include, as examples, time of day at which an image was captured, latitude and longitude of an image capture device, such as a camera, for example, etc. In another example, one or more parameters relevant to digital content, such as digital content comprising a technical article, as an example, may include one or more authors, for example. Claimed subject matter is intended to embrace meaningful, descriptive parameters in any format, so long as the one or more parameters comprise physical signals and/or states, which may include, as parameter examples, collection name (e.g., electronic file and/or electronic document identifier name), technique of creation, purpose of creation, time and date of creation, logical path if stored, coding formats (e.g., type of computer instructions, such as a markup language) and/or standards and/or specifications used so as to be protocol compliant (e.g., meaning substantially compliant and/or substantially compatible) for one or more uses, and so forth.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this disclosure, the term "transmission" is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present disclosure, to have particular implications with respect to the one or more signals being communicated, such as, for example, whether the signals are being communicated "to" a particular device, whether the signals are being communicated "from" a particular device, and/or regarding which end of a communication path may be initiating communication, such as, for example, in a "push type" of signal transfer or in a "pull type" of signal transfer. In the context of the present disclosure, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, such as either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular disclosure, a network protocol, such as for communicating between devices of a network, may be characterized, at least in part, substantially in accordance with a layered description, such as the so-called Open Systems Interconnection (OSI) seven-layer type of approach and/or description. A network computing and/or communications protocol (also referred to as a network protocol) refers to a set of signaling conventions, such as for communication transmissions, for example, as may take place between and/or among devices in a network. In the context of the present disclosure, the term "between" and/or similar terms are understood to include "among" if appropriate for the particular usage and vice-versa. Likewise, in the context of the present disclosure, the terms "compatible with," "comply with" and/or similar terms are understood to respectively include substantial compatibility and/or substantial compliance.

A network protocol, such as protocols characterized substantially in accordance with the aforementioned OSI description, has several layers. These layers are referred to as a network stack. Various types of communications (e.g., transmissions), such as network communications, may occur across various layers. A lowest level layer in a network stack, such as the so-called physical layer, may characterize how symbols (e.g., bits and/or bytes) are communicated as one or more signals (and/or signal samples) via a physical medium (e.g., twisted pair copper wire, coaxial cable, fiber optic cable, wireless air interface, combinations thereof, etc.). Progressing to higher-level layers in a network protocol stack, additional operations and/or features may be available via engaging in communications that are substantially compatible and/or substantially compliant with a particular network protocol at these higher-level layers. For example, higher-level layers of a network protocol may, for example, affect device permissions, user permissions, etc.

A network and/or sub-network, in an embodiment, may communicate via signal packets and/or signal frames, such via participating digital devices and may be substantially compliant and/or substantially compatible with, but is not limited to, now known and/or to be developed, versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX, AppleTalk and/or the like. Versions of the Internet Protocol (IP) may include IPv4, IPv6, and/or other later to be developed versions.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including a version of Long Term Evolution (LTE), WLAN, Wireless Router (WR) mesh, 2nd, 3rd, or 4th generation (2G, 3G, or 4G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), IEEE 802.11 (including, but not limited to, IEEE 802.11b/g/n), and/or the like. A wireless network may include virtually any type of now known and/or to be developed wireless communication mechanism and/or wireless communications protocol by which signals may be communicated between devices, between networks, within a network, and/or the like, including the foregoing, of course.

Figure 11:
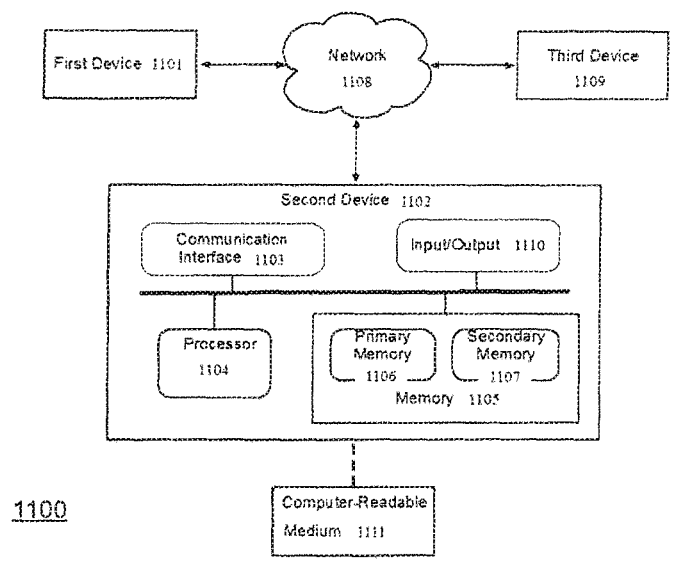
FIG. 11 is a diagram illustrating an embodiment of a computing and/or communications network environment.

In one example embodiment, as shown in FIG. 11, a system embodiment may comprise a local network (e.g., devices 1101, 1102, 1104, 1109 and computer-readable medium 1111) and/or another type of network, such as a computing and/or communications network. For purposes of illustration, therefore, FIG. 11 shows an embodiment 1100 of a system that may be employed to implement either type or both types of networks. Network 1108 may comprise one or more network connections, links, processes, services, applications, and/or resources to facilitate and/or support communications, such as an exchange of communication signals, for example, between a computing device, such as 1102, and another computing device, such as 1101 and/or 1109, which may, for example, comprise one or more client computing devices and/or one or more server computing device. By way of example, but not limitation, network 1108 may comprise wireless and/or wired communication links, telephone and/or telecommunications systems, Wi-Fi networks, Wi-MAX networks, the Internet, a local area network (LAN), a wide area network (WAN), or any combinations thereof.

Example devices in FIG. 11 may comprise features, for example, of a client computing device and/or a server computing device, in an embodiment. It is further noted that the term computing device may be employed to implement a control system, as previously discussed and refers at least to a processor and a memory connected by a communication bus. Likewise, in the context of the present disclosure at least, this is understood to refer to sufficient structure within the meaning of 35 § USC 112 (f) so that it is specifically intended that 35 § USC 112 (f) not be implicated by use of the term "memory," "memory cell," "memory array" and/or similar terms; however, if it is determined, for some reason not immediately apparent, that the foregoing understanding cannot stand and that 35 § USC 112 (f) therefore, necessarily is implicated by the use of these and/or similar terms, then, it is intended, pursuant to that statutory section, that corresponding structure, material and/or acts for performing one or more functions be understood and be interpreted to be described at least in FIGS. 2, 4, 6, 7 and 8 and the associated paragraphs of the present disclosure.

Referring now to FIG. 11, in an embodiment, first and third devices 1101 and 1109 may be capable of rendering a graphical user interface (GUI) for a network device and/or a computing device, for example, so that a user-operator may engage in system use. Device 1102 may potentially serve a similar function in this illustration. Likewise, in FIG. 11, computing device 1101 ('first device' in figure) may interface with computing device 1102 ('second device' in figure), which may, for example, also comprise features of a client computing device and/or a server computing device, in an embodiment. Processor (e.g., processing device) 1104 and memory 1105, which may comprise primary memory 1106 and secondary memory 1107, may communicate by way of a communication interface bus 1103, for example. The term "computing device," in the context of the present disclosure, refers to a system and/or a device, such as a computing apparatus, that includes a capability to process (e.g., perform computations) and/or store digital content, such as electronic files, electronic documents, measurements, text, images, video, audio, etc. in the form of signals and/or states. Thus, a computing device, in the context of the present disclosure, may comprise hardware, software, firmware, or any combination thereof (other than software per se). Computing device 1102, as depicted in FIG. 11, is merely one example, and claimed subject matter is not limited in scope to this particular example.

For one or more embodiments, a computing device may comprise, for example, any of a wide range of digital electronic devices, including, but not limited to, desktop and/or notebook computers, cellular telephones, tablet devices, wearable devices, personal digital assistants, or any combination of the foregoing. Further, unless specifically stated otherwise, a process as described, such as with reference to flow diagrams and/or otherwise, may also be executed and/or affected, in whole or in part, by a computing device and/or a network device. A device, such as a computing device and/or network device, may vary in terms of capabilities and/or features. Claimed subject matter is intended to cover a wide range of potential variations. For example, a device may include a web-enabled device including a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n/h, etc., and/or worldwide interoperability for microwave access (WiMAX). A computing device and/or a networking device may also have a subscriber identity module (SIM) card, which, for example, may comprise a detachable or embedded smart card that is able to store subscription content of a user, and/or is also able to store a contact list. A user may own the computing device and/or network device or may otherwise be a user, such as a primary user, for example. A device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a computing and/or communications network may be embodied as a wired network, wireless network, or any combinations thereof.

A computing and/or network device may include and/or may execute a variety of now known and/or to be developed operating systems, derivatives and/or versions thereof, including computer operating systems, such as Windows, iOS, Linux, a mobile operating system, such as iOS, Android, Windows Mobile, and/or the like. A computing device and/or network device may include and/or may execute a variety of possible applications, such as a client software application enabling communication with other devices. For example, one or more messages (e.g., content) may be communicated, such as via one or more protocols, now known and/or later to be developed, suitable for communication of email, short message service (SMS), and/or multimedia message service (MMS), including via a network. A computing and/or network device may also include executable computer instructions to process and/or communicate digital content, such as, for example, textual content, digital multimedia content, and/or the like. A computing and/or network device may also include executable computer instructions to perform a variety of possible tasks, such as browsing, searching, playing various forms of digital content, including locally stored and/or streamed video, and/or games such as, but not limited to, fantasy sports leagues. The foregoing is provided merely to illustrate that claimed subject matter is intended to include a wide range of possible features and/or capabilities.

In FIG. 11, computing device 1102 may provide one or more sources of executable computer instructions in the form physical states and/or signals (e.g., stored in memory states), for example. Computing device 1102 may communicate with computing device 1101 by way of a network connection, such as via network 1108, for example. As previously mentioned, a connection, while physical, may not necessarily be tangible. Although computing device 1102 of FIG. 11 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 1105 may comprise any non-transitory storage mechanism. Memory 1105 may comprise, for example, primary memory 1106 and secondary memory 1107, additional memory circuits, mechanisms, or combinations thereof may be used. Memory 1105 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 1105 may be utilized to store a program of executable computer instructions. For example, processor 1104 may fetch executable instructions from memory and proceed to execute the fetched instructions. Memory 1105 may also comprise a memory controller for accessing device readable-medium 1111 that may carry and/or make accessible digital content, which may include code, and/or instructions, for example, executable by processor 1104 and/or some other device, such as a controller, as one example, capable of executing computer instructions, for example. Under direction of processor 1104, a non-transitory memory, such as memory cells storing physical states (e.g., memory states), comprising, for example, a program of executable computer instructions, may be executed by processor 1104 and able to generate signals to be communicated via a network, for example, as previously described. Generated signals may also be stored in memory, also previously suggested.

Memory 1105 may store electronic files and/or electronic documents, such as relating to one or more users, and may also comprise a device-readable medium that may carry and/or make accessible content, including code and/or instructions, for example, executable by processor 1104 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Referring again to FIG. 11, processor 1104 may comprise one or more circuits, such as digital circuits, to perform at least a portion of a computing procedure and/or process. By way of example, but not limitation, processor 1104 may comprise one or more processors, such as controllers, microprocessors, microcontrollers, application specific integrated circuits, digital signal processors, programmable logic devices, field programmable gate arrays, the like, or any combination thereof. In various implementations and/or embodiments, processor 1104 may perform signal processing, typically substantially in accordance with fetched executable computer instructions, such as to manipulate signals and/or states, to construct signals and/or states, etc., with signals and/or states generated in such a manner to be communicated and/or stored in memory, for example.

FIG. 11 also illustrates device 1102 as including a component 1110 operable with input/output devices, for example, so that signals and/or states may be appropriately communicated between devices, such as device 1102 and an input device and/or device 1102 and an output device. A user may make use of an input device, such as a computer mouse, stylus, track ball, keyboard, and/or any other similar device capable of receiving user actions and/or motions as input signals. Likewise, a user may make use of an output device, such as a display, a printer, etc., and/or any other device capable of providing signals and/or generating stimuli for a user, such as visual stimuli, audio stimuli and/or other similar stimuli.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

The invention claimed is:

1. An apparatus comprising: a ferroelectric memory cell; the ferroelectric memory cell having at least one word-line and at least one bit-line, wherein the lines are connected to the ferroelectric memory cell so as to generate a voltage signal level difference across the ferroelectric memory cell, the ferroelectric memory cell comprising a ferroelectric capacitor of ferroelectric material such that polarization of the ferroelectric memory cell is capable of being switched to an opposite polarization via a sufficient voltage signal level difference of opposite polarity to be generated across the ferroelectric memory cell, the ferroelectric material further being such that polarization of the ferroelectric memory cell does not change unless the sufficient voltage signal level difference to be generated is to exceed a coercive voltage signal level value associated with the particular ferroelectric material;

wherein the at least one word-line to comprise a first word-line voltage signal level; the first word-line voltage signal level to exceed a second word-line voltage signal level;

wherein the at least one bit-line to comprise a second bit-line voltage signal level; a first bit-line voltage signal level to exceed the second bit-line voltage signal level;

wherein the first word-line voltage signal level to comprise a voltage signal level of about half of the sufficient voltage level difference in a first polarity, and the second bit-line voltage signal level to comprise a voltage signal level of about half of the sufficient voltage level difference in a second polarity;

wherein a binary signal value state is to be written to or to be read from the ferroelectric memory cell, the ferroelectric memory cell to not have an associated memory cell selector, the at least one word-line to comprise the first word-line voltage signal level and the at least one bit-line to comprise the second level bit-line voltage signal level such that the voltage signal level difference across the ferroelectric memory cell to be generated is to exceed the coercive voltage signal level value in the first polarity.

2. The apparatus of claim 1, wherein the ferroelectric memory cell is part of an array of ferroelectric memory cells and the array is coupled to a silicon substrate containing circuitry to drive operation of the array of ferroelectric memory cells.

3. The apparatus of claim 2, wherein the array comprises a cross-point array.

4. The apparatus of claim 2, wherein the silicon substrate to have been manufactured in accordance with a semiconductor manufacturing process having an associated supply voltage level, and wherein the voltage signal level difference across the ferroelectric memory cell to be generated is to exceed the associated supply voltage level.

5. The apparatus of claim 4, wherein the silicon substrate further comprises a series of sense amplifiers to be coupled to the bit-lines of the ferroelectric memory cells of the array; and wherein the first word-line voltage and the second bit-line voltage are respectively adjusted by an equalization voltage of one half of the supply voltage level for the series of sense amplifiers.

6. The apparatus of claim 1, wherein the ferroelectric memory cell is selector-free.

7. An apparatus comprising: an array of respective ferroelectric memory cells;

the respective ferroelectric memory cells of the array having at least one word-line to be disposed in a first dimension and to be in communication with at least a first sense amplifier and at least one bit-line to be disposed in a second dimension and to be in communication with at least a second sense amplifier, wherein the lines are connected to the respective ferroelectric memory cells of the array so as to respectively generate a voltage signal level difference across the respective ferroelectric memory cells of the array, the respective ferroelectric memory cells of the array comprising a ferroelectric capacitor of ferroelectric material such that polarization of the respective ferroelectric memory cells is capable of being switched to an opposite polarization via a sufficient voltage signal level difference of opposite polarity to be generated across the respective ferroelectric memory cells, the ferroelectric material further being such that polarization of the respective ferroelectric memory cell does not change unless the sufficient voltage signal level difference to be generated is to exceed a coercive voltage signal level value associated with the particular ferroelectric material;

wherein the at least one word-line to comprise a first word-line voltage signal level; the first word-line voltage signal level to exceed a second word-line voltage signal level;

wherein the at least one bit-line to comprise a second bit-line voltage signal level; a first bit-line voltage signal level to exceed the second bit-line voltage signal level;

wherein the first word-line voltage signal level to comprise a voltage signal level of about half of the sufficient voltage level difference in a first polarity, and the second bit-line voltage signal level to comprise a voltage signal level of about half of the sufficient voltage level difference in a second polarity;

wherein a binary signal value state is to be read from or written to any one of the respective ferroelectric memory cells by addressing the first dimension and the second dimension of the array in a manner to result in the at least one word-line of the any one of the respective ferroelectric memory cells to comprise the first word-line voltage signal level and to result the at least one bit-line of the any one of the respective ferroelectric memory cells to comprise the second level bit-line voltage signal level such that the voltage signal level difference across the any one of the respective ferroelectric memory cells to be generated is to exceed the coercive voltage signal level value in the first polarity.

8. The apparatus of claim 7, wherein the ferroelectric memory cell comprises a selector-free ferroelectric memory cell.

9. The apparatus of claim 8, wherein the array is symmetric in the first and the second dimensions.

10. The apparatus of claim 9, wherein any stored binary signal value states of the array are able to be read in a manner to result in a transpose of the stored binary value states.

11. A method of operating a ferroelectric memory cell including at least one word-line and at least one bit-line, the ferroelectric memory cell comprising a ferroelectric capacitor of ferroelectric material such that polarization of the ferroelectric memory cell is capable of being switched to an opposite polarization via a sufficient voltage signal level difference of opposite polarity generated across the ferroelectric memory cell, the ferroelectric material further being such that polarization of the ferroelectric memory cell does not change unless the sufficient voltage signal level difference generated exceeds a coercive voltage signal level value associated with the particular ferroelectric material, the method comprising:

switching the at least one word-line between a second word-line voltage signal level and a first word-line voltage signal level; the first word-line voltage signal level to exceed the second word-line voltage signal level;

switching the at least one bit-line between a first bit-line voltage signal level and a second bit-line voltage signal level; the first bit-line voltage signal level to exceed the second bit-line voltage signal level;

wherein the first word-line voltage signal level comprises a voltage signal level of about half of the sufficient voltage level difference in a first polarity, and the second bit-line voltage signal level comprises a voltage signal level of about half of the sufficient voltage level difference in a second polarity; and wherein the switching of the at least one word-line and the at-least one bit line comprises generating a voltage signal level difference across the selector-free ferroelectric memory cell that exceeds a coercive voltage signal level value associated with the particular ferroelectric material such that polarization of the ferroelectric memory cell is switched to an opposite polarization.

12. The method of claim 11, wherein the generating the voltage signal level difference across the ferroelectric memory cell results in reading a binary signal value state.

13. The method of claim 11, wherein the generating the voltage signal level difference across the ferroelectric memory cell results in writing a binary signal value state.

14. The method of claim 11, wherein the ferroelectric memory cell comprises a selector-free ferroelectric memory cell.

15. The method of claim 14, wherein the selector-free ferroelectric memory cell comprises a memory cell of an array of selector-free ferroelectric memory cells.

16. The method of claim 15, wherein the array is coupled to a silicon substrate containing circuitry to drive operation of the selector-free ferroelectric memory cells.

17. The method of claim 16, wherein the array comprises a cross-point array.

18. The method of claim 17, wherein the silicon substrate includes sense amplifiers coupled to respective bit-lines and respective word-lines that address respective selector-free ferroelectric memory cells.

19. The method of claim 18, wherein the array is symmetric with respect to the respective bit-lines and the respective word-lines.

20. The method of claim 19, and further comprising: switching the respective word-lines and the respective bit-lines of the selector-free ferroelectric memory cells containing binary signal value states in a manner comprising generating a voltage signal level difference across the selector-free ferroelectric memory cells containing binary signal value states such that the signal voltage level differences exceeds a coercive voltage signal level value associated with the particular ferroelectric material such that polarization of the selector-free ferroelectric memory cells containing binary signal value states is switched to an opposite polarization so as to read out a transpose of the selector-free ferroelectric memory cells containing binary signal value states.

* * * * *